United States Patent [19]
Kanbara et al.

[11] Patent Number: 5,091,823
[45] Date of Patent: Feb. 25, 1992

[54] INVERTER DEVICE

[75] Inventors: Takatsugu Kanbara, Funabashi; Hiroshi Asabuki, Sakura; Satoshi Ibori, Funabashi; Kengo Hasegawa, Sakura; Kenji Nandou, Matsudo; Takehiko Yanagida, Tsuchiura; Naoto Suzuki; Shigeyuki Baba, both of Funabashi; Hiroshi Fujii, Chiba; Takuji Torii, Ushiku, all of Japan

[73] Assignee: Hitachi, Ltd., Tokyo, Japan

[21] Appl. No.: 711,492

[22] Filed: May 28, 1991

Related U.S. Application Data

[63] Continuation of Ser. No. 401,012, Aug. 31, 1989, abandoned.

[30] Foreign Application Priority Data

Aug. 31, 1988 [JP] Japan ............................. 63-214967
Feb. 17, 1989 [JP] Japan ............................. 1-36150

[51] Int. Cl.$^5$ .............................................. H05K 7/20
[52] U.S. Cl. ..................................... 361/384; 361/395; 361/424; 174/35 R
[58] Field of Search .................. 174/35 MS, 35 R; 361/383–395, 399, 424

[56] References Cited

U.S. PATENT DOCUMENTS

| | | | |
|---|---|---|---|
| 4,035,711 | 7/1977 | Piller | 361/384 |
| 4,249,033 | 2/1981 | Darakjy et al. | 361/424 |
| 4,399,487 | 8/1983 | Neumann | 361/394 |
| 4,752,861 | 6/1988 | Niggl et al. | 361/424 |
| 4,797,782 | 1/1989 | Wistling | 361/424 |
| 4,872,102 | 10/1989 | Getter | 361/383 |

Primary Examiner—Gregory D. Thompson
Attorney, Agent, or Firm—Antonelli, Terry Stout & Kraus

[57] ABSTRACT

In an inverter device comprising a main circuit section which switches a power at high speed, having a switching element and a smoothing condenser for smoothing the power supplied to the switching element, and a logic section for controlling the main circuit section, a shielding member is disposed between the main circuit section and the logical section. The shielding member includes a combination of a heat shielding member and an electromagnetic shielding member so as to protect the logic section from heat, electromagnetic noise, and vibration generated in the main circuit section for improving reliability of the inverter device.

41 Claims, 20 Drawing Sheets

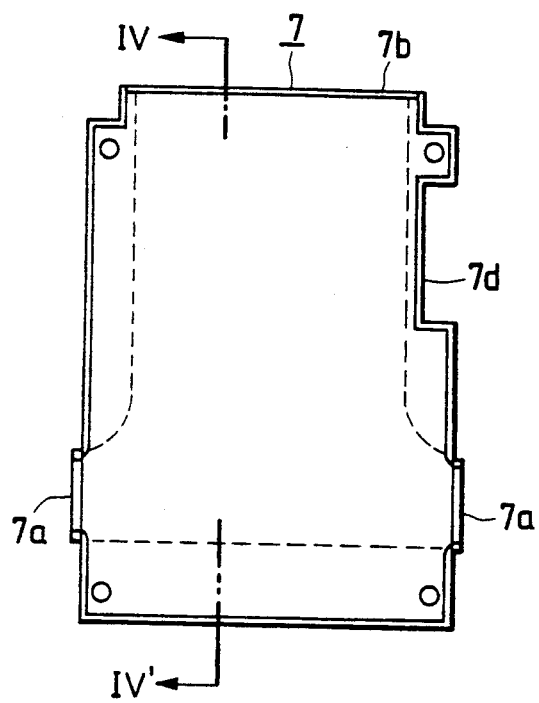
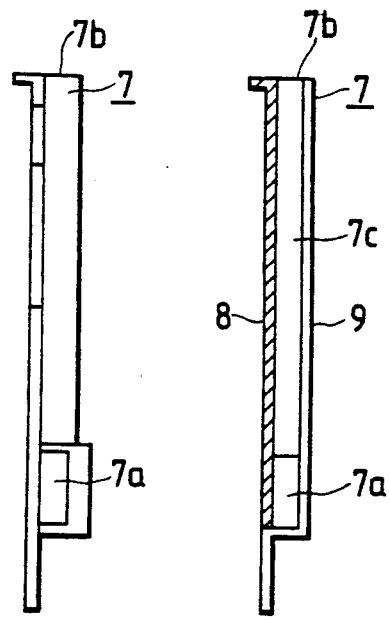
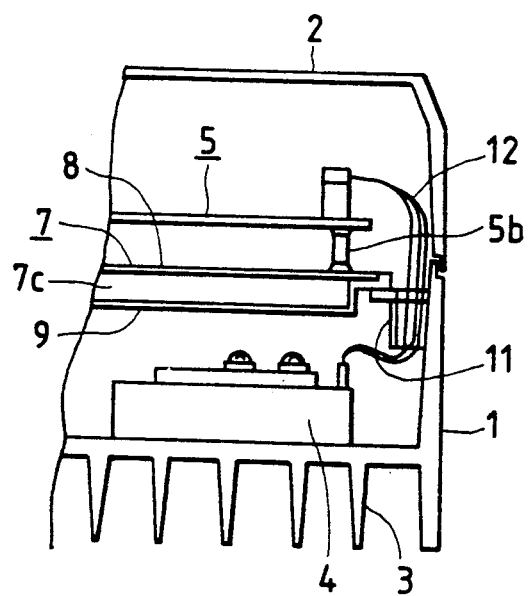

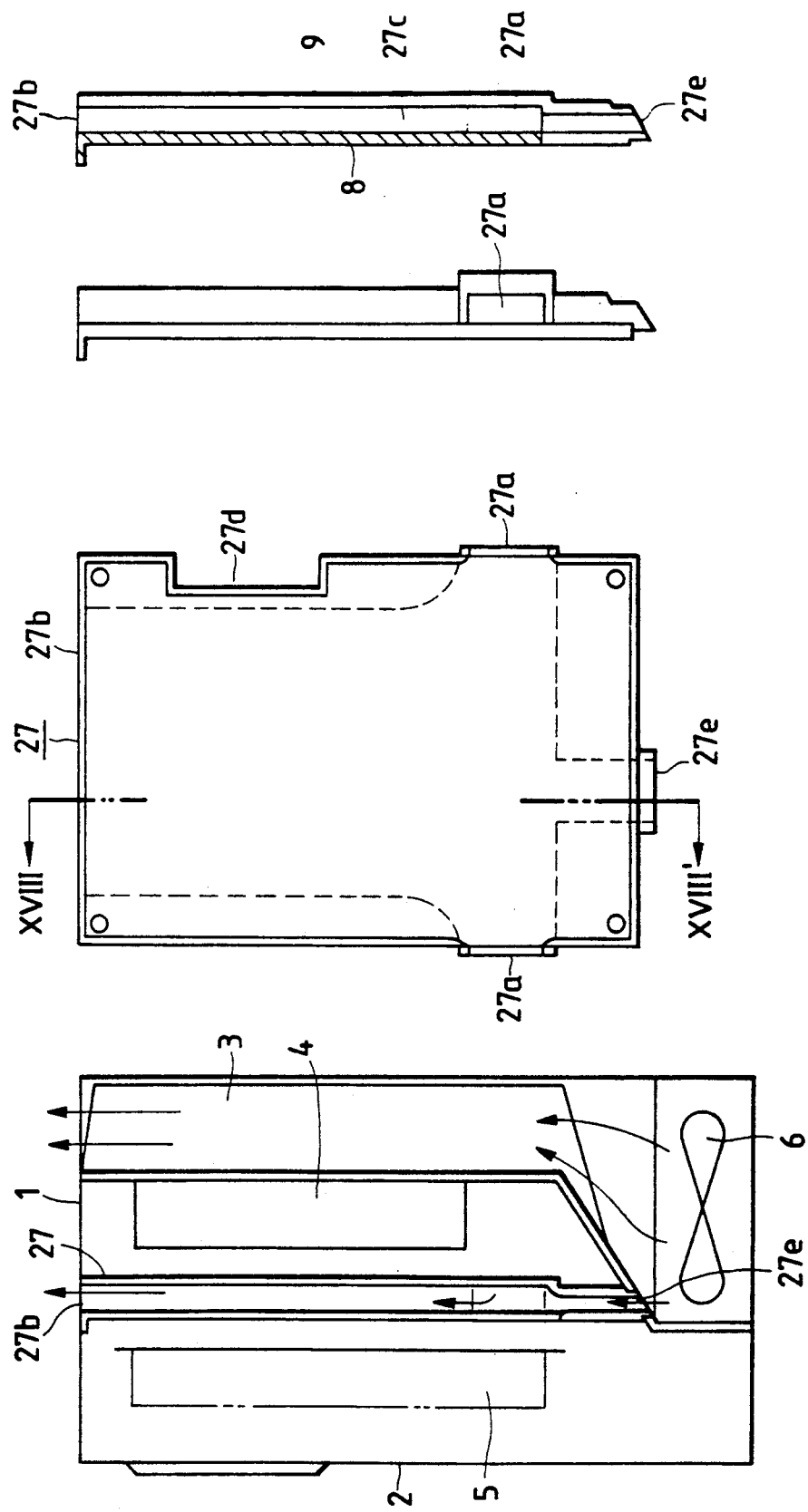

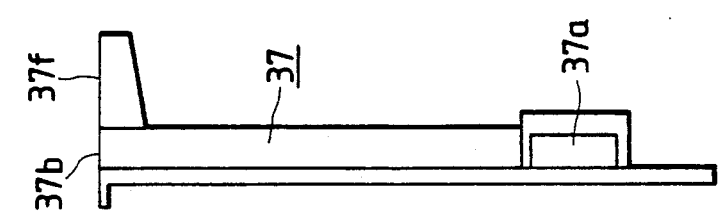
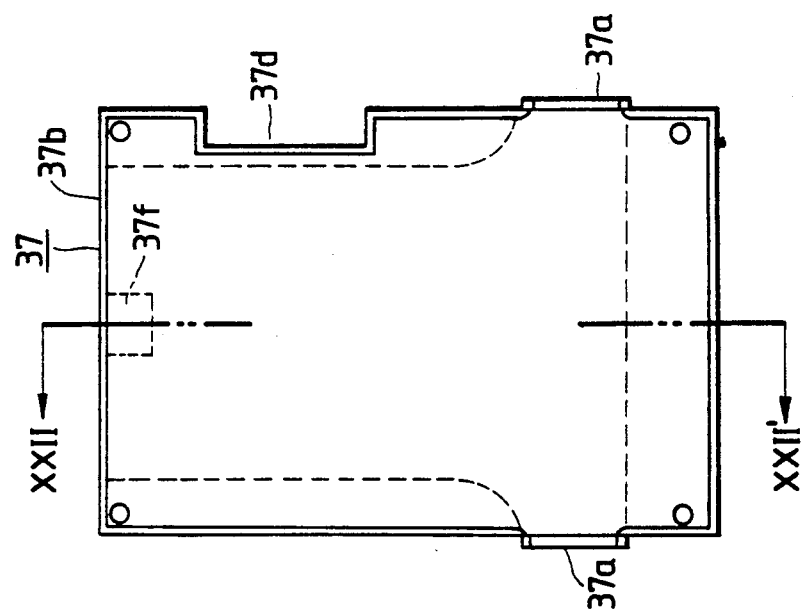
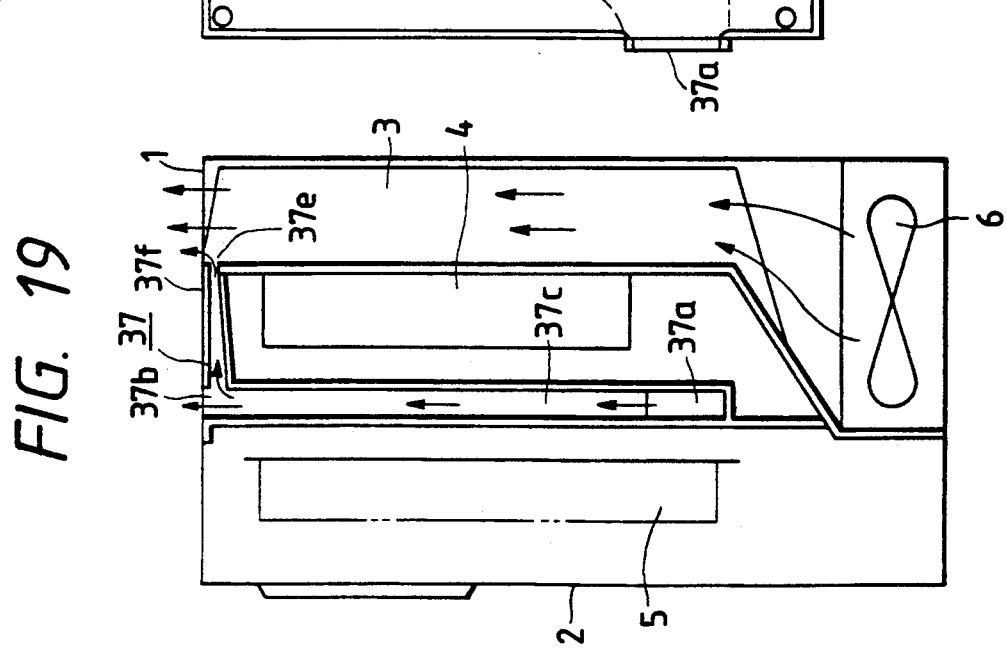

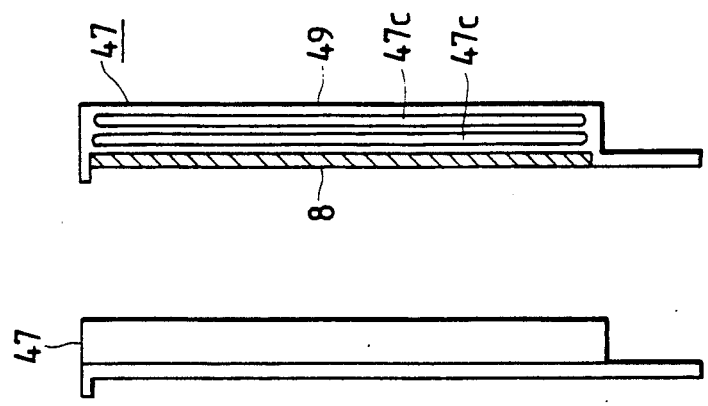
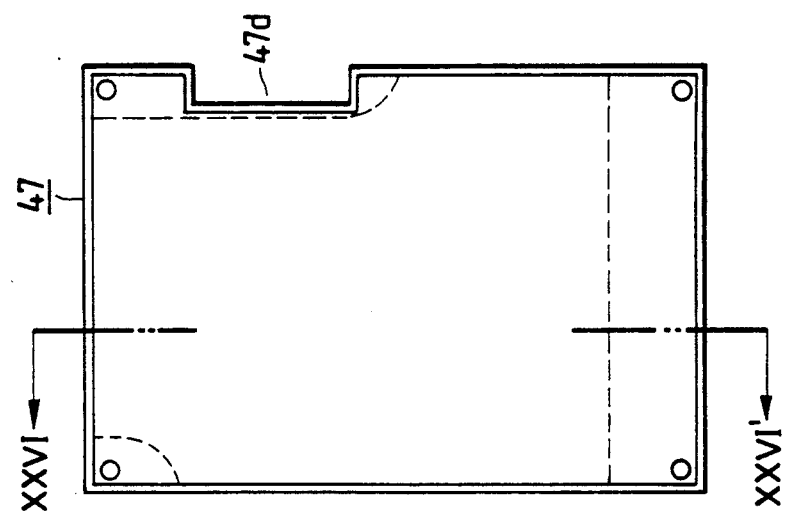
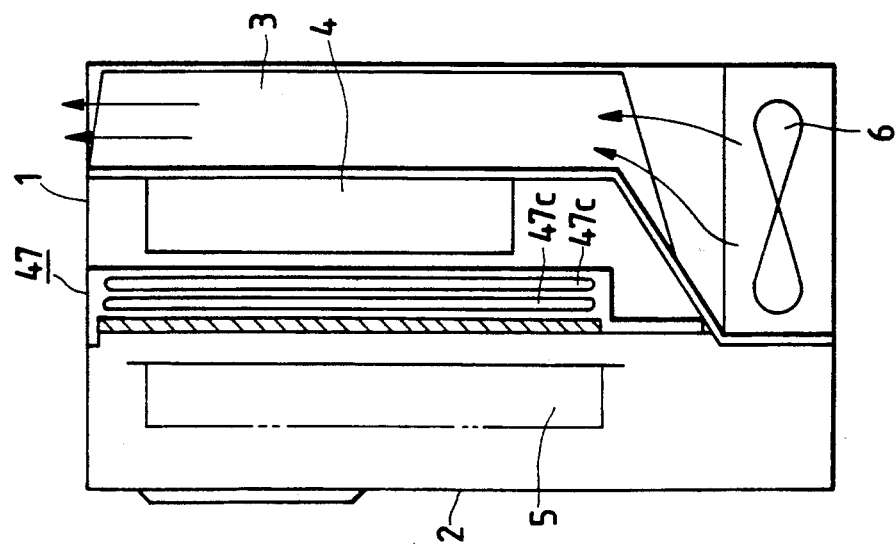

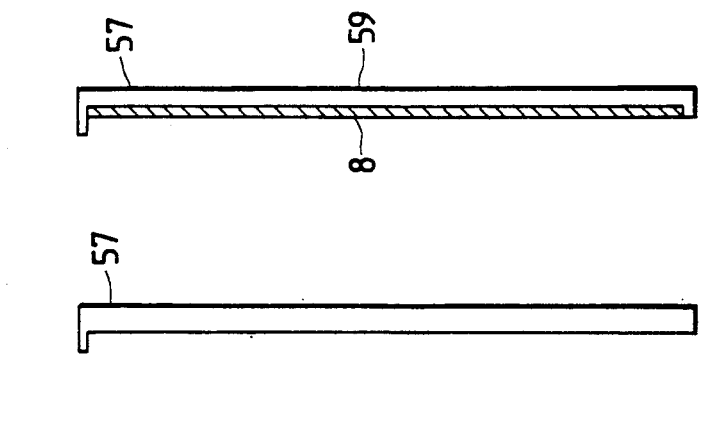
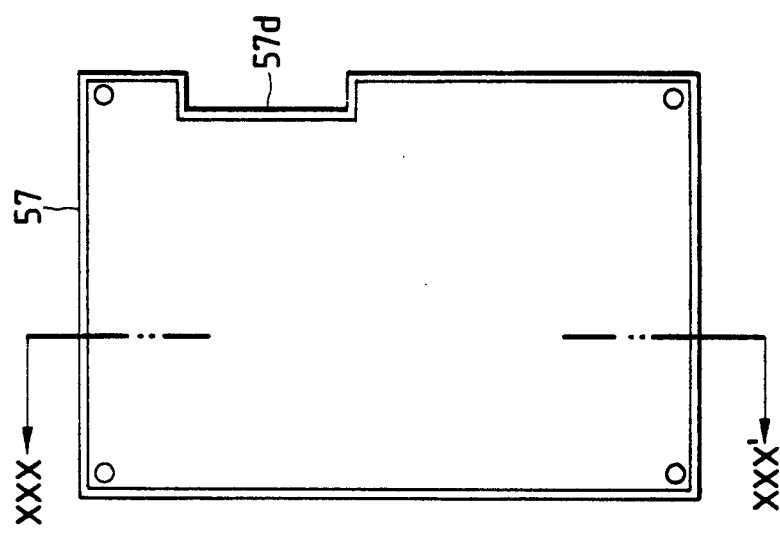
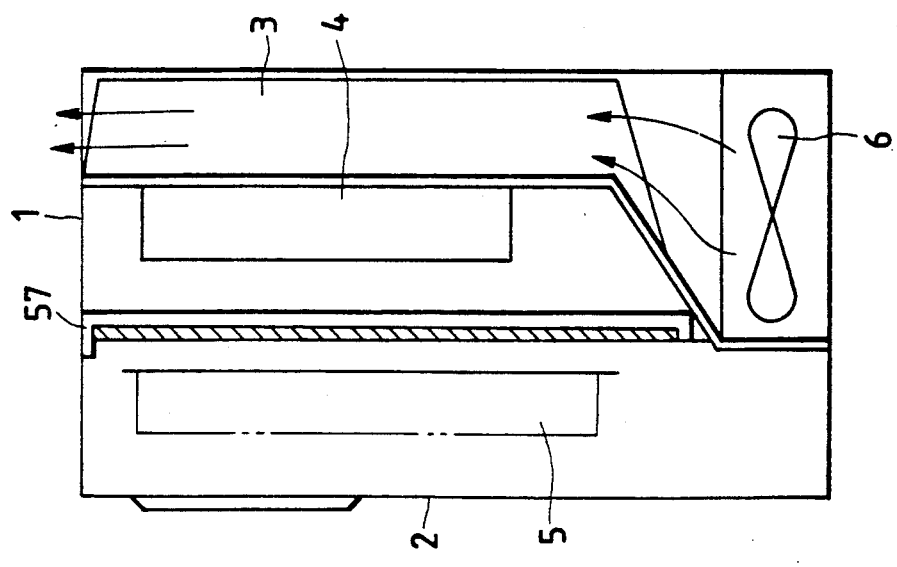

INVERTER DEVICE

This application is a continuation of application Ser. No. 07/401,012, filed on Aug. 31, 1989, now abandoned.

BACKGROUND OF THE INVENTION

1. Field of the Invention

This invention relates to an inverter device having in one casing a main circuit section which is a source of heat, a logical section and components of low heat resistance such as smoothing capacitors. More particularly, the present invention relates to an actual mounting structure suitable for improvement of reliability having a device of closed or totally enclosed structure.

2. Description of the Prior Art

An inverter device is generally composed of a main circuit section and a logical section. In a conventional inverter device, the main circuit section and the logical section are contained in, one casing as disclosed in Laid-Open Japanese Utility Model Registration No. 61-153499. The main circuit section which produces a large amount of heat is directly mounted to cooling fins for air cooling. The logical section, although producing little heat, has low resistance to heat and accordingly requires a lowering of ambient air temperature. Where the logical section and the main circuit section are housed in one casing, the air around the logical section is heated by the large amount of heat produced from the main circuit section, resulting in an increased logical section temperature. To prevent a temperature rise in the logical section in excess of its permissible temperature, large-sized cooling fins are provided for the main circuit section, or a cooling fan is installed, thus increasing the cooling capacity in order to lower the heat of the main circuit section. The main circuit section, having a switching function, is likely to become a noise source to the logical section. In order to prevent this electromagnetic noise, a space is provided between the main circuit section and the logical section, and an electromagnetic shield plate is also provided, thereby preventing misoperation of the logical section due to electromagnetic noise.

Due to the fact no shield is used particularly for thermal separation between the main circuit section and the logical section, the air heated by the main circuit section elements, which produces a large amount of heat, flows into the logical section between the electromagnetic shield plate disposed between the main circuit section and the logical section, and the inner wall of the casing, resulting in an increased air temperature around the logical section. The air thus heated by the main circuit section will heat the electromagnetic shield plate. The electromagnetic shield plate made of iron sheet for the purpose of improving the magnetic shield effect is a good heat conductor, which is likely to raise the air temperature on the logical section side. In the inverter device containing the main circuit section and the logical section in one casing as described above, there is the problem that an air temperature rise occurs around the logical section less resistant to heat from the main circuit section. Furthermore, it is necessary to provide sufficient space to dispose an electromagnetic shield plate for electromagnetic noise prevention between the main circuit section and the logical section. This is disadvantageous from the standpoint of reducing the size of the device.

Furthermore, the conventional device, as stated in Japanese Utility Model Registration No. 60-151186, includes heat-generating parts, such as switching elements, and a smoothing capacitor both contained in one casing, above the terminal of the smoothing capacitor is located a printed circuit board mounted with a control circuit of the switching element. No means is provided for cooling the smoothing capacitor and no protective means is provided for protection of a control circuit in the event of a rupture of the smoothing capacitor caused by overcurrent. A smoothing capacitor cooling structure has been disclosed in Japanese Utility Model Registrations No. 61-47699 and 61-67994.

SUMMARY OF THE INVENTION

It is an object of the invention to provide a highly reliable inverter device capable of effectively cooling the main circuit section and logical section of the inverter device and protecting the logical section from heat generated from the main circuit section, thereby preventing their failure and misoperation.

It is another object of the invention to provide a highly reliable inverter device capable of effectively cooling the main circuit section and logical section of the inverter device and reducing electromagnetic noise from the main circuit section to the logical section for the purpose of preventing misoperation of the logical section.

A further object of the invention is to provide a highly reliable inverter device capable of effectively cooling the smoothing capacitor for the purpose of prolonging the life of the smoothing capacitor.

The above-described objects can be attained by an inverter device having a main circuit section including a heat-generating element; a logical section disposed apart from the main circuit section; a shielding member disposed between the main circuit section and the logical section; and a cooling means for cooling the main circuit section; the above-mentioned main circuit section and the logical section being contained in independent chambers separated by the shielding member.

In a preferred embodiment of this invention, the shielding member is provided as a refrigerant passage between the main circuit section and the logical section.

In another preferred embodiment, the shielding member has an air inlet port at the bottom end and an air exhaust port at the top end such that external air may flow into the refrigerant passage.

Furthermore, in the inverter device comprising a main circuit section including a heat-generating element; a logical section disposed apart from the main circuit section; a heat shielding member disposed between the main circuit section and the logical section; and a cooling means having a refrigerant passage in which a refrigerant for cooling the main circuit section flows; a magnetic shielding member is disposed on the logical section side of the heat shielding member.

In the preferred embodiment, there is provided an air stratum between the heat shielding member and the magnetic shielding member.

The above-described objects can be accomplished b comprising the inverter device of a main circuit section including a heat-generating element; a logical section disposed apart from the main circuit section; a shielding member disposed between the main circuit section and the logical section; and a cooling means having a refrigerant passage in which a refrigerant for cooling the main circuit section flows; the main circuit section having smoothing capacitors and the smoothing capacitors are partly disposed in the refrigerant passage.

In the preferred embodiment, the cooling means described above has cooling fins, which have a bent section so formed as to lead the refrigerant to the smoothing capacitors. According to this invention, a conductive material of a shield plate is employed to shield electromagnetic noise produced from the main circuit section, thereby effectively improving noise resistance.

Since the logical section of low permissible temperature is not affected by heat from the main circuit section, trouble and misoperation of the logical section likely to be caused by heat can be prevented.

Furthermore, according to the preferred embodiment of the invention comprising a combination of a heat shielding member and an electromagnetic shield member, it is possible to prevent the passage of vibration to the logical section, and accordingly to prevent logical section trouble resulting from the vibration, consequently enhancing its reliability.

The cooling means cools the switching element to prevent temperature rise therein. At least some of capacitors are cooled by the cooling means, and therefore a temperature rise of the capacitors themselves can be lowered, thereby preventing the deterioration of dielectrics in the capacitors. The shielding means serves to prevent adhesion of ejection from a ruptured capacitor to, or impairment of, the printed circuit board of the logical section.

DESCRIPTION OF THE DRAWINGS

FIGS. 2 to 4 are, respectively, a plan view, a side view, and a side sectional view along section line IV—IV' showing a shielding plate according to the embodiment;

FIG. 5 is a sectional view showing a portion of the shielding plate where a cable passes through;

FIG. 15 is a side sectional view showing an inverter device in a second embodiment of the invention;

FIGS. 16 to 18 are, respectively, a plan view, a side view and a side sectional view along section lines XVIII—XVIII' showing the shielding plate according to the embodiment;

FIG. 19 is a side sectional view showing an inverter device according to a third embodiment of the present invention;

FIGS. 20 to 22 are a plan view, a side view and a side sectional view respectively showing a shielding plate in the embodiment;

FIG. 23 is a side sectional view showing an inverter device in a fourth embodiment of the invention;

FIGS. 24 to 26 are a plan view, a side view and a side sectional view respectively showing the shielding plate of this embodiment;

FIG. 27 is a side sectional view showing an inverter device in a fifth embodiment of the invention;

FIGS. 28 to 30 are a plan view, a side view and a side sectional view respectively showing a shielding plate of the embodiment;

DESCRIPTION OF THE PREFERRED EMBODIMENTS

Figure 1:
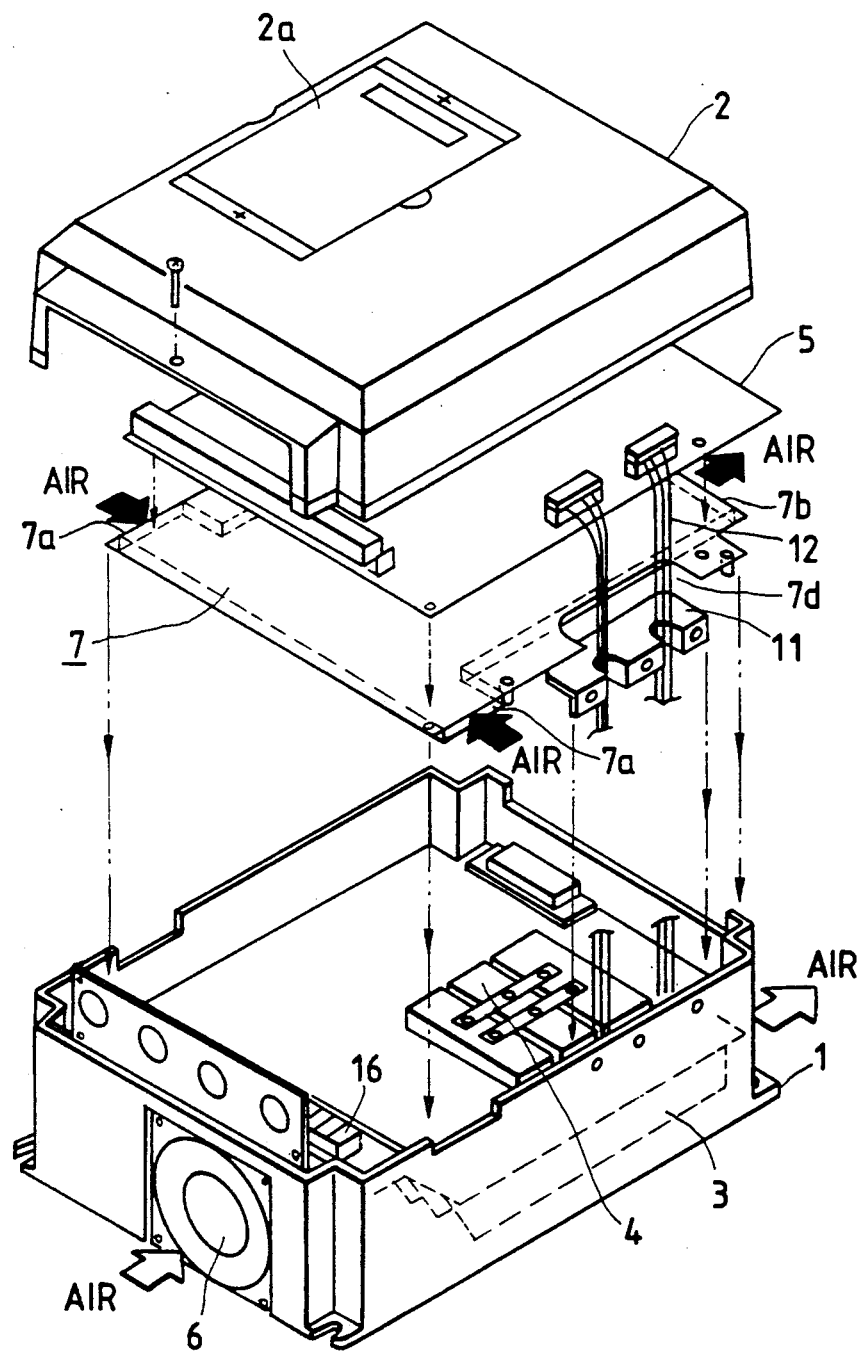
FIG. 1 is an exploded view in perspective of an inverter device according to a first embodiment of the invention.
Figure 6:
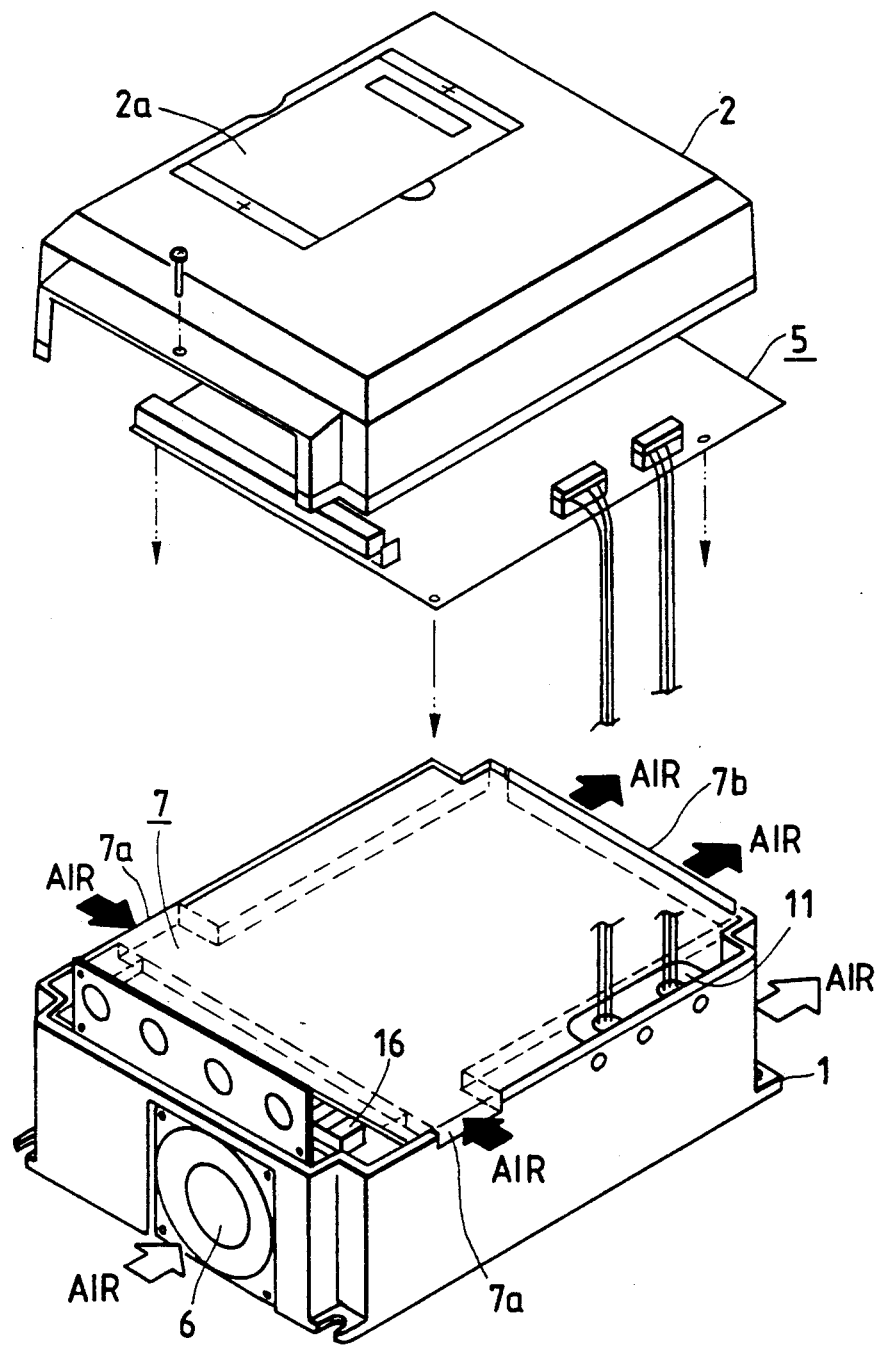
FIG. 6 is an exploded view in perspective of the shielding plate installed.

A first embodiment of the invention will be described by referring to FIGS. 1 to 14.

The inverter device consists of principal parts including a main circuit section 4 comprising a rectifying device 106, a smoothing capacitor 103, and a switching element 104 as a control element, and a logical circuit section (hereinafter logical section) 5 which controls it. The recifying device 106 is connected at the primary side to an a.c. power source 111 (a three-phase a.c. power source in this embodiment) and at the secondary side to the smoothing capacitor 10 and to the primary side of the switching element 104. In the embodiment, the smoothing capacitor 103 comprises a couple of capacitors 103a and 103b which are connected in parallel. The secondary side of the switching element 104 is connected to a load M such as a motor. The logical section 5 is connected to the main circuit section 4 through a cable 12, and controls the switching element while detecting the voltage and current at the primary side of the switching element 104. On the primary side of the rectifying device 106 is connected a cooling fan 6.

Figure 7:
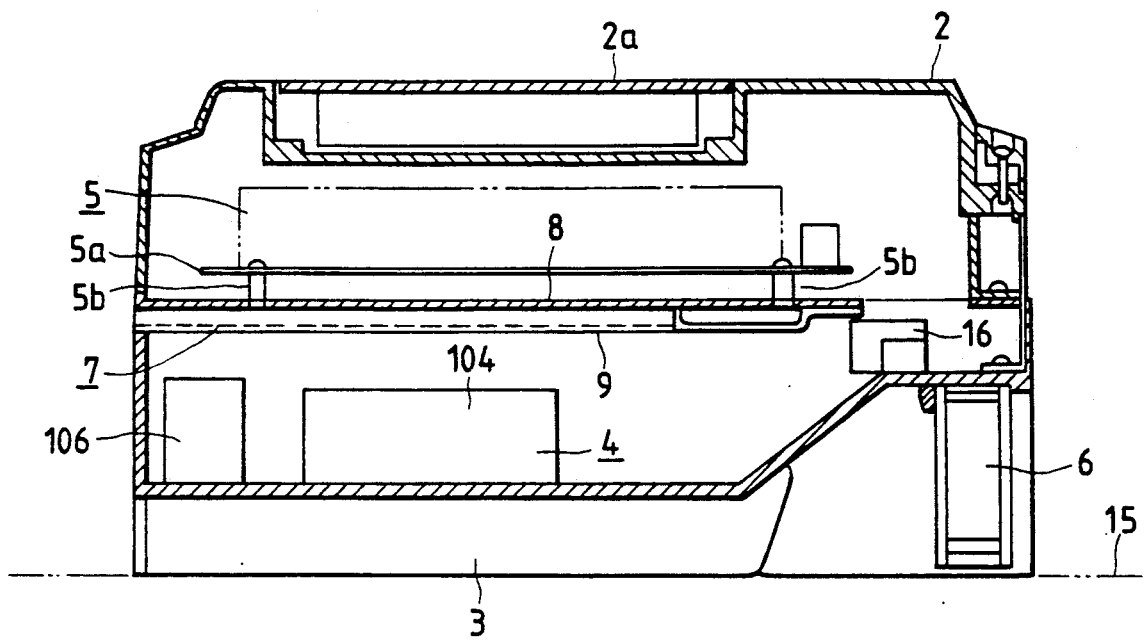
FIG. 7 is a side sectional view showing the inverter device of this embodiment.
Figure 8:
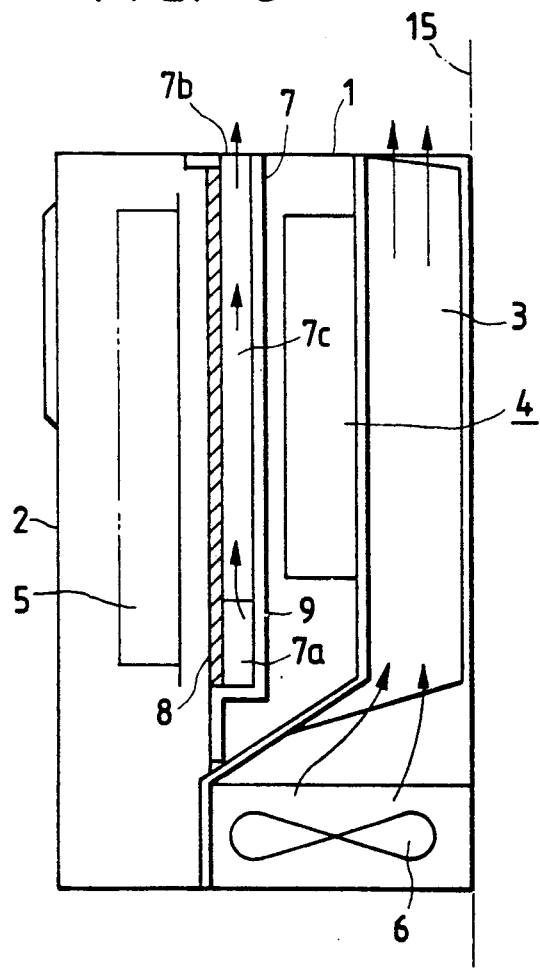
FIG. 8 is a side sectional view showing the flow of wind in this embodiment.

In this embodiment, a shielding plate 7 is used between the main circuit section 4 and the logical section 5 in order to decrease a gap for the purpose of flow of air therebetween, and in addition the shielding plate 7 on the logical section side, electrically conductive material 8 such as an iron sheet so as to provide the shielding plate 7 with heat insulation effect and magnetic shielding effect. Furthermore, a wind tunnel is formed as a refrigerant passage between the sections, into which air is passed to enhance the heat insulation effect. Therefore, the main circuit section 4 and the logical section 5 are disposed in independent chambers. The inverter device of this embodiment has a circuit constitution shown in FIG. 9 comprises, concretely as shown in FIG. 1, a case 1 as a first casing, a cover 2 as a second casing, heat dissipating fins 3 as a cooling means, a main circuit section which is a heat generating body as well as a source of noise, a logical section 5 disposed apart from the main circuit section, a cooling fan 6, and a wind tunnel-type shielding plate 7 which shields heat and electromagnetic noise produced from the main circuit section. The logical section 5 and the main circuit section 4 are connected by the cable 12. Between the cooling fins 3 are formed refrigerant passages in which the air as a refrigerant flows. Detail of the wind tunnel-type shielding plate 7 is shown in FIGS. 2 to 4. In FIGS. 1, 7 and 8, the smoothing capacitor 103 is not illustrated. FIGS. 2. 3 and 4 are a plan view, a side view and Section IV—IV' respectively, showing the wind tunnel-type shielding plate 7. The wind tunnel-type shielding plate 7 of this embodiment is of such a structure that an electrically-conductive material 8 having a function to shield electromagnetic noise generated from the main circuit section 7 is enclosed with a heat and electric insulating material 9, and moreover has air inlet ports 7a on both sides in the lower part and an air exhaust port 7b in the upper part, and a wind tunnel 7c is provided between the electrically-conductive material 8 and the insulating material 9, such that the outside air will flow inside the shielding plate. Also, in this embodiment, the wind tunnel-type shielding plate functions as a second refrigerant passage. The electrically-conductive material 8 is enclosed with the insulating material 9 so as not to come in contact with the case and protects the logical section 5 from the electromagnetic noise.

In the vicinity of the lower part of the shielding plate 7 is provided a terminal 16 for connection between the power source and the load. Also, in the wind tunnel type shielding plate 7 is formed a cutout section 7d for installing the cable 12 connecting between the logical section 5 and the main circuit section 4.

In this embodiment, in order to prevent the flow into the logical section 5 of heat leaking from the main circuit section 4 through between the cutout section 7d of the wind tunnel-type shielding plate 7 and the case 1, there is provided a cable holder 11 as a closing means, in which the cable 12 is fitted, and then installed behind the case 1. The cable holder 11 has the minimum necessary amount of gap for passing the cable 12 through as shown in FIG. 5, and therefore when the main circuit section 4 and the logical section 5 are mounted in the case 1, the air can hardly pass through these sections and the wall of the case 1, thereby preventing heat from passing from the main circuit section 4 to the logical section 5.

The installation of the cable 12 can readily be performed first by fixing it to the case 1 and then by fitting the wind tunnel-type shielding plate 7 to the case 1. Thus the positioning of the cable 12 can be effected with ease as shown in FIG. 16 and accordingly cable installation can be accomplished efficiently. In this embodiment, the logical section 5 is mounted on the printed board 5a, which is separated with a spacer 5b at a specific distance from the wind tunnel-type shielding plate 7. There is also formed an air stratum between the shielding plate 7 and the logical section 5, thereby further improving the heat insulating effect.

The effect of the wind tunnel-type shielding plate 7 will be described below. About 50 to 60 percent of all the heat generated at the main circuit section 4 will be discharged out through the cooling fins 3 and the cooling fan 6. Remaining 50 to 40 percent of the heat, however, will be discharged into the case, resulting in air temperature increase inside the inverter device. In the meantime, the logical section 5 located in the same case will be exposed to the heat (hot air) discharged from the main circuit within the case. The temperature at the logical section 5 at this time exceeds the temperature of the logical section 5 itself. However, the provision of the wind tunnel-type shielding plate 7 between the main circuit section 4 and the logical section 5 completely separates the space between the main circuit section 4 and the logical circuit section 5, and in addition there is a heat insulating material 9 on the main circuit side, thus the heat of the main circuit section 4 can be stopped thereat. Furthermore, since the outside air flows in a wind tunnel 7c formed in the wind tunnel-type shielding plate 7, the electrically conductive material 8 is cooled with the outside air, and is kept at low temperatures. Also since the heat on the logical section 5 side can be discharged through the electrically conductive material 8, the logical section 5 will be cooled, thereby holding the temperature at the logical section 5 much lower. With these advantages, the embodiment of this invention has the following effects.

The logical section 5 has a lower permissible temperature than the main circuit section 4, and accordingly a temperature rise thereat is due to heat generated at the logical section 5 itself. The logical section 5, therefore, will not be affected by the heat from the main circuit section 4. Consequently, the cooling fins 3 can be decreased in size according to the permissible temperature the main circuit section 4. In addition, as the electrically conductive material 8 of the wind tunnel-type shielding plate 7 is able to check the electromagnetic noise coming from the main circuit section 4, and a gap between the logical section 5 and the main circuit section 4 can be decreased. This embodiment, as described above, is effective for reducing the size of devices such as the inverter device and providing improvement in noise resistance. Furthermore, it is possible to prevent trouble and misoperation of the logical section, thus enhancing reliability.

The inverter device is subject to external vibration of maximum 0.5 G depending upon its location. In the inverter device also, there exists vibration-producing parts such as a fan, an electromagnetic contactor, etc. In the meantime, the logical section 5 comprised of a printed board includes an electrolytic capacitor, a transformer, etc., which will, in the worst case, drop if they are subjected to excess vibration. An ideal method for preventing this is to use a vibration-resistant wind tunnel-type shielding plate 7 having no resonant point, for securing the printed board 5a of the logical section 5. In this embodiment, the wind tunnel-type shielding plate 7 is hardly affected by stress and vibration because of its laminated structure consisting of two sheets of an electrically conductive material (steel) and an insulating material 9 (plastics). The plastics insulating material 9 is produced from polycarbonate resin, polybutylene resin, or the like.

Moreover, the shielding plate 7 will not resonate if there occurs harmonic noise from the logical section 5 or the main circuit section 4, and therefore the noise can be reduced.

After the installation of the shielding plate 7 and the logical section 5, as shown in FIG. 7, the logical section 5 is covered with the cover 2, the main circuit section 4 and the logical section 5 are separated from outside. The inverter device, therefore, functions as a totally enclosed inverter device. On the cover 2 is mounted a control section 2a, which is set in a concaved section formed in the cover 2. To provide a totally-enclosed type inverter device, the inverter device may be so that the interior thereof will be separated from the outside.

Generally, when the inverter device is used, the case 1 is secured on the equipment mounting plate 15 of the control panel. The inverter device is usually mounted on the equipment mounting plate 15 with the fan 6 down as shown in FIG. 8. In this state, a stream of forced air from the fan 6 flows through in the space between the case 1 and the equipment mounting plate 15, cooling the fins 3. In the wind tunnel 7c of the wind tunnel-type shielding plate 7, the outside air flows from the intake air port 7a toward the exhaust air ports 7b. In the wind tunnel 7c, therefore, low-temperature air flows, preventing heat transmission from the main circuit section 4 to the logical section 5, and at the same time cooling the electrically conductive material 8 to dissipate heat generated from the logical section 5.

Next, a smoothing capacitor cooling structure according to this embodiment will be described.

Figure 10:
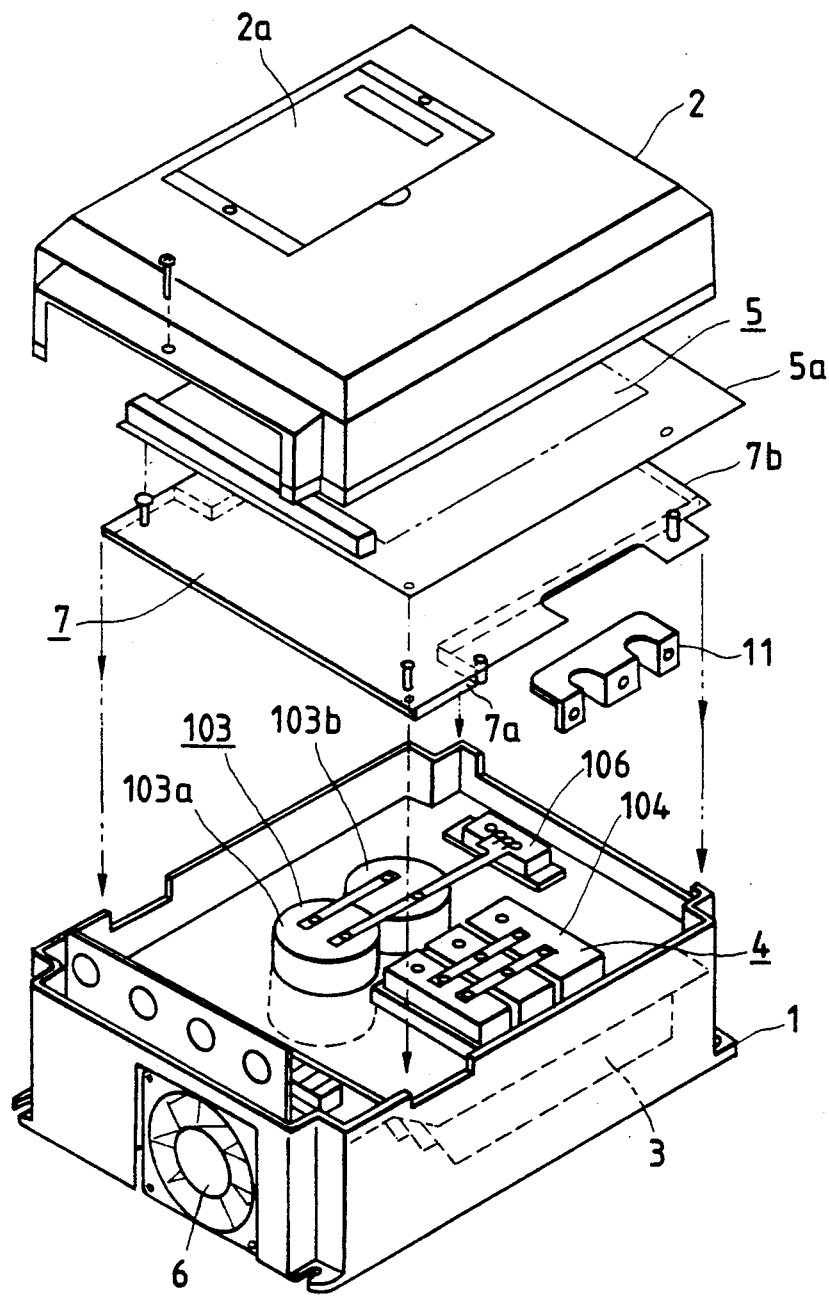
FIGS. 10, 11 and 12 are a perspective view, a side sectional view and a bottom view respectively showing the inverter device according to the first embodiment of the present invention respectively.

In the inverter device of this embodiment, the cooling fins 3, a smoothing capacitor 103, a rectifying device 106, a switching element 104 which produces heat, and the cooling fan 6 are mounted in the lower case 1 as shown in FIG. 10. The smoothing capacitor 103 is mounted such that a part thereof is disposed in the refrigerant passage, passing through in the lower case 1 and projecting out on the cooling fin 3 side.

Figure 9:
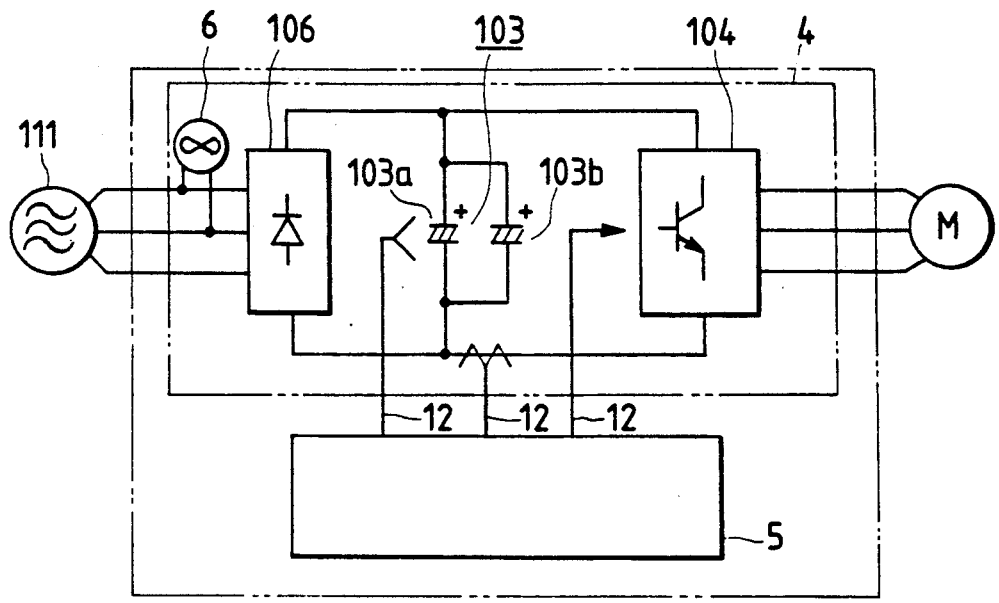
FIG. 9 is a circuit diagram showing the circuit of this embodiment.
Figure 11:
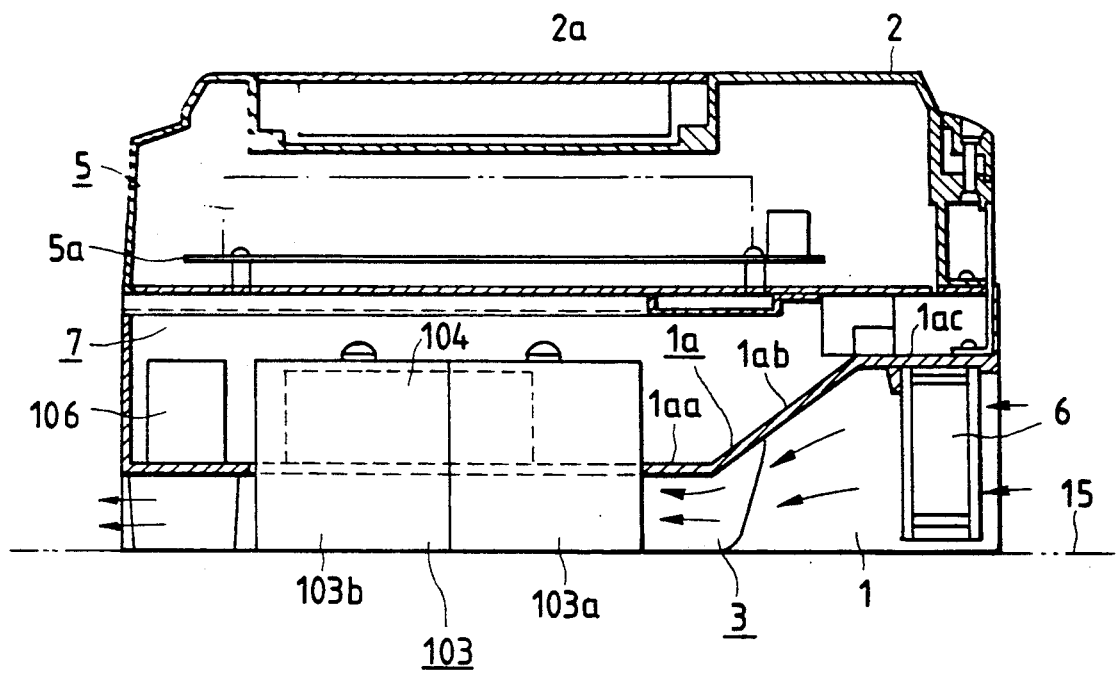
Figure 12:
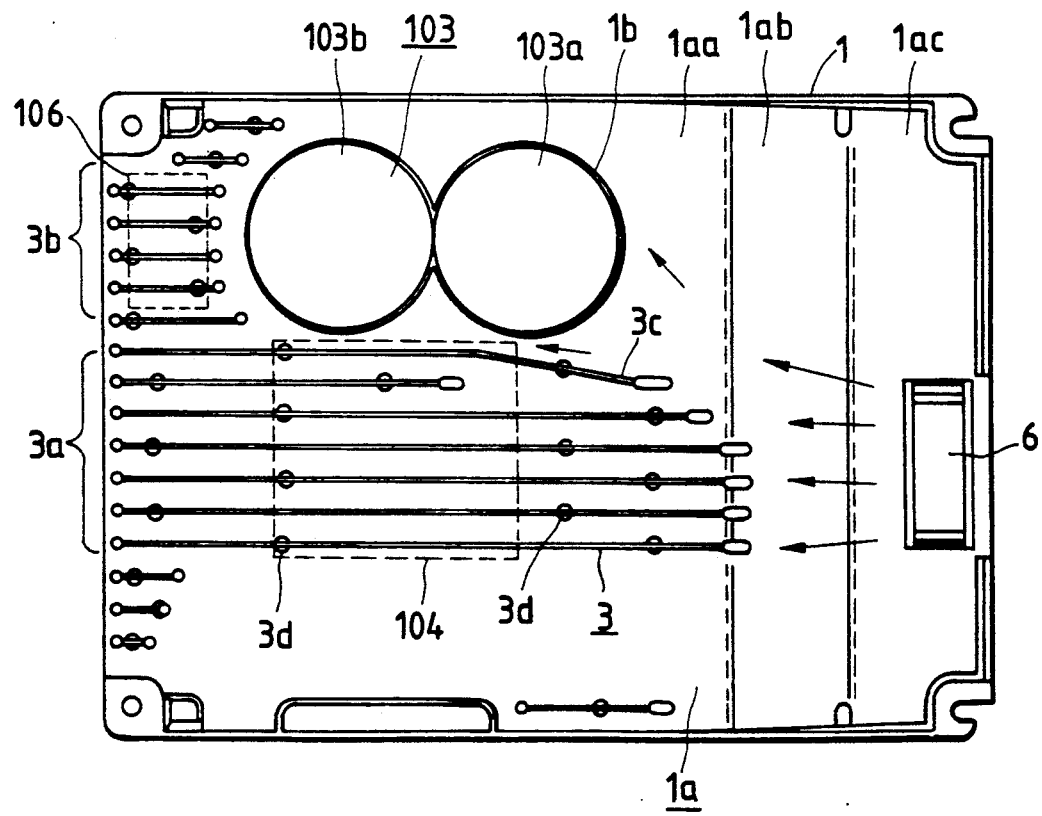

According to the embodiment, the cooling fins 3 and the lower case 1 are formed of aluminum die casting. Above the capacitor 103 and the switching element 4 is provided the shielding plate 7 as a shielding means. Furthermore, above the shielding plate 7 is located a printed board 5a with the logical section 5 is mounted. Above this printed board 5a is an upper case 2. On this upper case 2 is mounted an operation panel 2a. In this embodiment, the interior of the inverter device is separated, from above, into a first chamber, a second chamber and a third chamber by the shielding plate 7 and the bottom 1a of the lower case 1. The first and second chambers are of a totally-enclosed structure for the purpose of preventing the entry of foreign substances from outside and also preventing the direct contact of a human body with a charge section. As shown in FIG. 11, the bottom surface 1a of the case 1 is located a specific distance removed from the lower end of the lower case 1, such that when the inverter device is mounted on the control panel (not illustrated), the space between the equipment mounting surface 15 (FIG. 11) of the control panel and the bottom surface 1a will serve as a refrigerant passage. The bottom surface 1a of the lower case has a position 1aa for mounting the switching element 104 and a position 1ac for mounting the cooling fan 6, these positions being formed so as to differ in distance from the lower end of the lower case. Between the positions 1aa and 1ac is provided an inclined surface 1ab so that the air from the cooling fan 6 smoothly flows into the switching element mounting section 1aa. At this switching element mounting section 1aa, there is provided a small distance between the lower end surface of the lower case and the bottom surface 1a in an attempt to speed up the velocity of the air flow for the purpose of obtaining a designed cooling capacity. The bottom surface 1a has a hole 1b for mounting the capacitor 103. In this embodiment, as shown in FIG. 9, two capacitors are used in parallel connection to increase the capacity of the capacitor 103, and accordingly an "8"-shaped hole 1b is adopted. A clearance between the hole 1b and the capacitors 103a and 103b is closed with a gasket (not illustrated) for safety. The cooling fins 3 are mounted on a surface opposite to the bottom surface 1a on which the switching element 104 is mounted, that is, on the surface on the side the cooling fan 6 is mounted. In this embodiment, as shown in FIG. 12, the cooling fins 3 are provided mainly in a part in which such elements generating much heat as the switching element 104 and the rectifying device 106 are mounted. There are provided a plurality of cooling fins 3a under the switching element 104, which are nearly the same length in direction (a lateral direction in FIG. 12) of the switching element mounting surface 1aa. These fins are arranged at specific spacings in order to obtain a specific cooling surface area. Of the cooling fins 3a, those which are located near the capacitor 103 have a bent section 3c so formed as to allow the flow of part of air from the cooling fan 6 towards the capacitor 103. The bent section 3c is mostly located at the upstream side of the switching element 104. Under the rectifying device 106 also, there are provided cooling fins 3b. Since the rectifying device 106 generates less heat as compared with the switching element 104, the fins are formed short. Furthermore, since the fins 3b are located at the downstream side of the capacitor 103 in relation to the stream of air from the cooling fan 6, heat from the cooling fins 3b can be controlled from heating the capacitor 103.

In this embodiment, gates 3d of the cooling fins are arranged in zigzag positions to allow smooth flow of air between fins.

Cooling the cooling fins 3 by the cooling fan 6 can dissipate out 50 to 60 percent of the total heat generated at the switching element 104. The remaining 50 to 40 percent of the heat remains within the case, resulting in an air temperature rise inside the device. Accordingly, the smoothing capacitor 103, if located in the same case, will be exposed to the hot air discharged into the case from the main circuit section 4, being heated in excess of the temperature of heat generated by itself. However, because the smoothing capacitor 103 partly passes through the lower case 1 and protrudes into the space between the lower case 1 and the equipment mounting plate 15, it is possible to reduce a heat effect of the main circuit section, thereby controlling a temperature rise.

Figure 13:
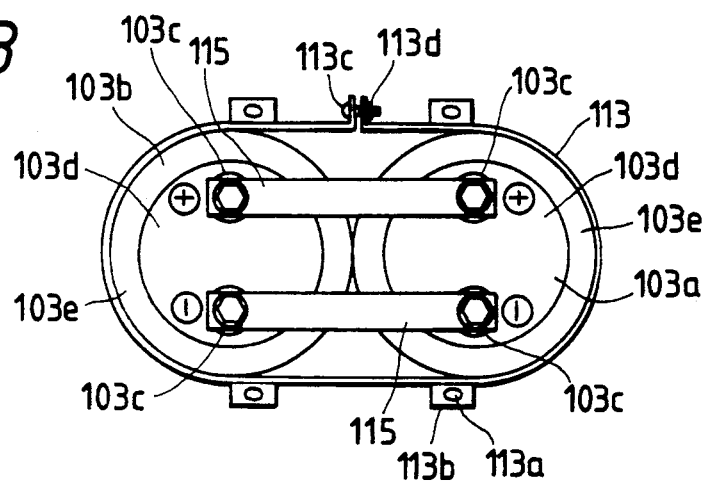
FIGS. 13 and 14 are a plan view and a side view respectively showing the configuration of a capacitor in this embodiment.
Figure 14:
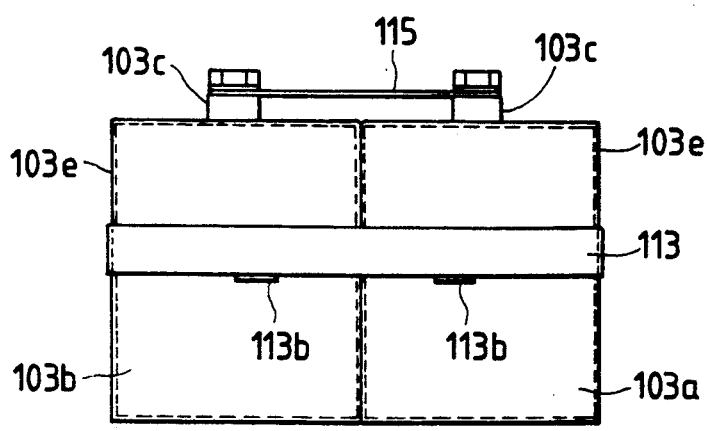

In the embodiment of this invention, the capacitor 103, as shown in FIGS. 13 and 14, includes capacitors 103a and 103b connected in parallel. A circuit diagram of this capacitor 103 is as shown in FIG. 9. In FIG. 9, numeral 111 is a three-phase a.c. power source, and M denotes a load. The two capacitors 103a and 103b are fastened in one body with a band 113 with their terminals 103c of the same polarity connected with a connecting bar 115. The band 113 is provided with four legs 113b each having a mounting hole 113a and fastened tightly to the capacitors 103a and 103b by screws 113c and nuts 113d. Thus, heat generated at the capacitors 103a and 103b can be passed to the bottom 1a of the lower case 1 through the legs 113b of the band 113. The capacitor, divided into two pieces, has a larger surface area than one capacitor of the same capacity and accordingly has a higher cooling efficiency.

In this embodiment, the smoothing capacitors 103a and 103b having a lower permissible temperature than the switching element 104 increase in temperature with heat of themselves and will hardly come to be subjected to the effect of the switching element 104. As the cooling fan 6 is able to cool both the smoothing capacitors 103a and 103b simultaneously, the temperature rise of these parts can be further lowered. Therefore, there is no necessity for providing a special means for cooling the smoothing capacitor 103. Besides, since it is not necessary to increase the capacity of the smoothing capacitor 103 for the purpose of decreasing the heat, capacitors corresponding to the current value of the inverter device can be used and furthermore the inverter device itself can be made smaller in size. In addition, because the temperature increase can be held low, it is possible to restrict the deterioration of the dielectric of the smoothing capacitor. Also, in this embodiment, the capacitors 103a and 103b are aluminum electrolytic capacitors and have a terminal 103c at an opening sealing member 103d provided at the opening of a capacitor case 103e. This type of electrolytic capacitor is commonly equipped with an explosion-proof valve as the opening sealing member for prevention of explosion in the event of overcurrent. The capacitors 103a and 103b used in this embodiment are also provided with explosion-proof valves (not illustrated) as the opening sealing member 103d. In this embodiment, the shielding plate 7 is provided between the opening sealing member 103d mounted with the terminal 103c of the capacitor 103 and therefore in the event that the explosion-proof valve operates, the printed board 5a and the logical section 5 can be protected from damage. Furthermore the shielding plate 7 is produced of the insulating material 9 on the main circuit side, that is, on the side facing the terminal 103c of the capacitor 103, and therefore in case the explosion-proof valve has operated, a charged section of the connecting bar 115 connected to the terminal 103c can be prevented from touching the electrically conductive material 8, thus improving safety.

Hereinafter the constitution of the shielding plate and the smoothing capacitor cooling structure will be described with reference to various types of embodiments.

A second embodiment of this invention will be explained by referring to FIGS. 15 to 18.

This embodiment, as shown in FIG. 15, gives an example using a wind tunnel-type shielding plate 27 that is constituted to allow the flow of a forced air from the fan 6 in the wind tunnel.

According to this embodiment, the wind tunnel-type shielding plate 27, as shown in FIG. 16, has air inlet ports 27a in the side of the lower part, an air outlet port 27b in the top, and an intake port 27e in the bottom communicating to the fan 6. In the side also, a cutout 27d is provided for passing the cable 12. Therefore, the stream of wind can be taken into the wind tunnel 27c not only by means of natural convection as well as by the cooling fan 6, and it is possible to perform powerful cooling of the logical section on the electrically conductive material 8 side. Other constitutions are the same as the first embodiment.

A third embodiment of the invention will be explained with reference to FIGS. 19 to 22. This embodiment, as shown in FIG. 19, is an example using a wind tunnel-type shielding plate 37 which utilizes a venturi effect provided by a high velocity of wind produced by the cooling fan 6. In this embodiment, the inverter device is so constituted as to lead the air from inside the wind tunnel shielding plate 37 out to the air outlet side of the cooling fins 3 through an opening 37e of a bypass 37f (a venturi effect) and to insure smooth air flow by connecting by the bypass 37f a space (where, because of a high wind velocity, the atmosphere is lower than that in the interior 37c of the wind tunnel shielding plate 37) between the vicinity of the air outlet port 37b of the wind tunnel shielding plate 37 and the cooling fins 3 through which the air from the cooling fan 6 is flowing at a high velocity. Therefore, the outside air is forcibly taken in through the air inlet ports 37a, more powerfully cooling the logical section 5 on the electrically conductive material 8 side.

In the side of the wind tunnel-type shielding plate 37 is provided with a cutout 37d for routing the cable 12 as shown in FIG. 20.

Other constitutions are the same as the first embodiment.

Hereinafter a fourth embodiment of this invention will be described with reference to FIGS. 23 to 26.

As shown in FIGS. 23 and 26, the inverter device of this embodiment is constituted such that heat insulation is provided by the use of a heat insulating material and the air trapped therein, that is, by using a laminated structure comprising chambers 47c and a heat-insulating material 49, in which no air flows but the air is trapped in, and the shielding plate 47 formed by laminating electrically conductive material 8. Because the shielding plate 47 of this embodiment requires no outside air to be taken in for cooling purpose, the structure of the case 1 for housing it may be simplified.

In this embodiment also, as shown in FIG. 24, the shielding plate 47 has a cutout 47d formed to route the cable.

Other constitutions are the same as the first embodiment.

A fifth embodiment of this invention will be explained with reference to FIGS. 27 to 30.

This embodiment is a further simplified version of the fourth embodiment.

The shielding plate 57 of this embodiment, as shown in FIG. 30, consists only of a heat insulating material 59 and the electrically conductive material 8, and can be used when the main circuit section generates little heat as shown FIG. 27. As this shielding plate is thin, the inverter device can be made much smaller in size.

In the above embodiments, the logical section using the shielding plate is hardly affected by both heat and electromagnetic noise, and accordingly does not require a large space. Besides, as the main circuit section cooling fins are required to cool only themselves regardless of the temperature at the logical section. The logical section, therefore, can be largely reduced in size. Furthermore, the logical section will come to be hardly affected by an increased temperature of air from the main circuit element, and accordingly the temperature increase of the logical circuit element can be held lower.

Figure 31:
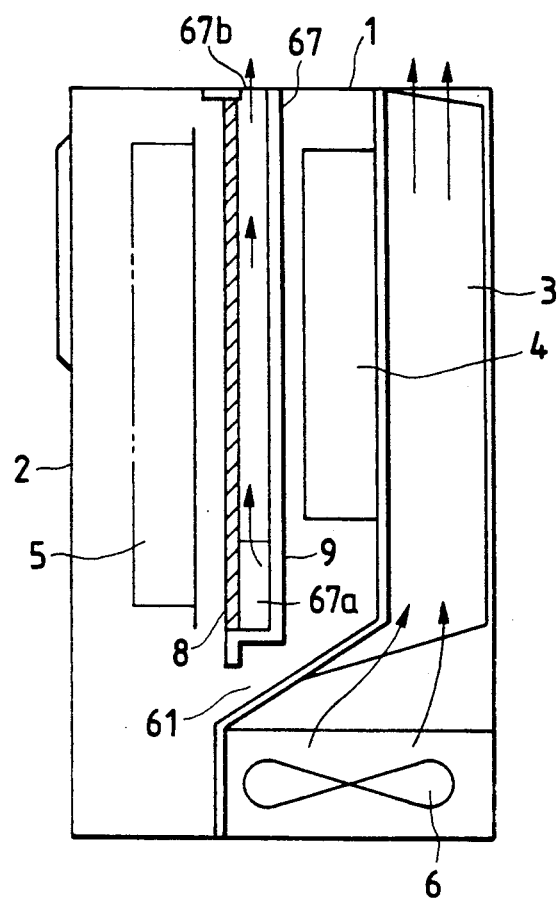
FIG. 31 is a side sectional view showing an inverter device in a sixth embodiment of the invention.

A sixth embodiment of this invention will be described with reference to FIG. 31.

The first to fifth embodiments have described examples in which a gap between the main circuit section and the logical section is fully closed with a shielding plate. In this sixth embodiment, however, the gap between the main circuit section and the logical circuit section is not fully closed on the bottom side of the inverter device by means of a shielding plate 67 as shown in FIG. 26. This is because that, since the air heated at the main circuit section goes upwardly, the temperature of air in the upper part (on the air outlet port 67b side) of the inverter device increases, but that, since the air temperature becomes lower as it goes downwardly towards the bottom (on the air inlet port 67a side), hot air will not flow into the logical section if a gap 61 as a communicating section exists at the bottom.

The air from the logical section 5 side flows into the circuit section 4 side through a gap 61, that is, low-temperature air is supplied to the main circuit section 4 side, thereby improving the cooling efficiency to cool the main circuit section 4. Other constitutions are the same as the first embodiment.

Beside the above-described embodiment in which the cooling fins 3 are cooled by forced cooling, this invention can similarly be applied also to small-type inverter devices in which little heat is generated at the main circuit section and accordingly natural cooling is adopted for cooling the cooling fins.

In the inverter device according to this embodiment described above, it is desirable to install a shielding plate nearly vertically in order to obtain a sufficient cooling effect, using a air passing through inside the shielding plate.

This invention may be applied not only to totally-enclosed or closed inverter devices but to open inverter devices.

Hereinafter various embodiments of the smoothing capacitor cooling structure will be described.

Figure 32:
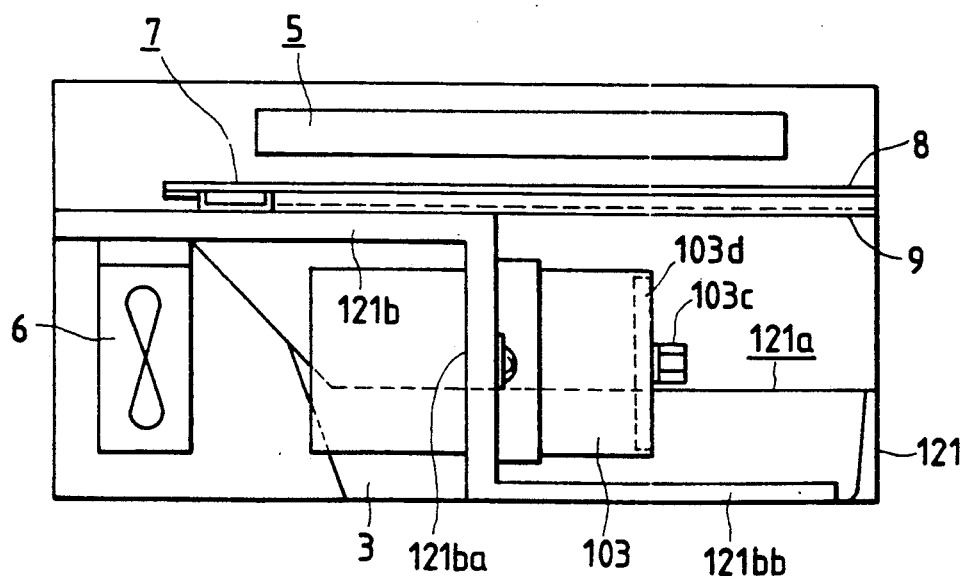
FIGS. 32 and 33 are a side sectional view and a bottom view respectively showing an inverter device in a seventh embodiment of the invention.
Figure 33:
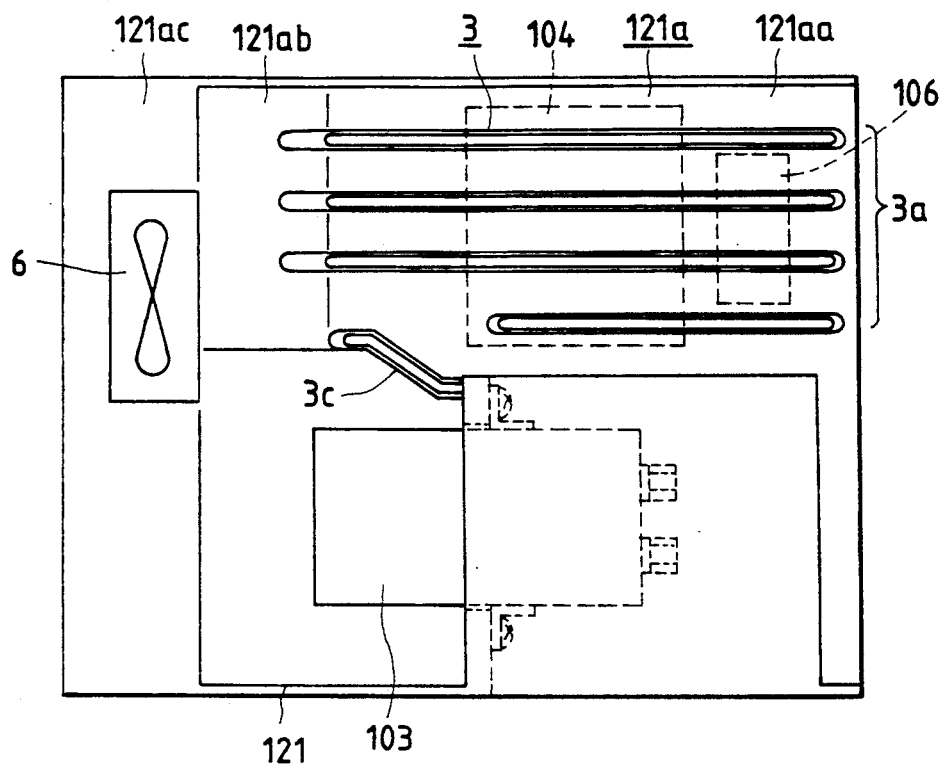

A seventh embodiment of this invention will be explained with reference to FIGS. 32 to 34.

Figure 34:
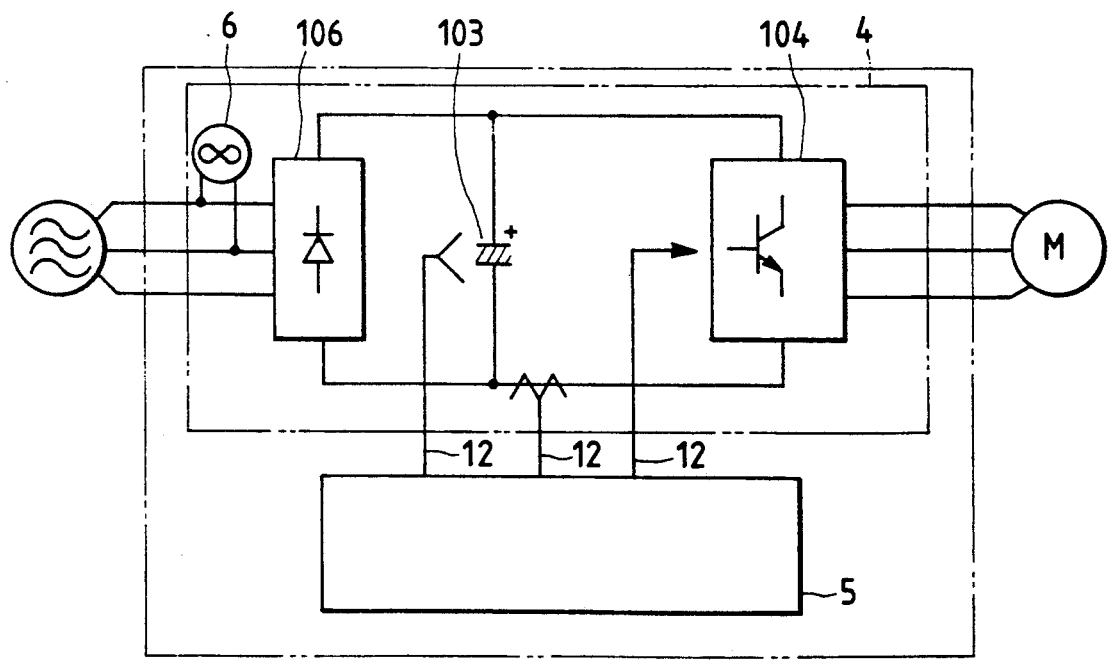
FIG. 34 is a block diagram showing a circuit of the inverter device according to this embodiment.

In this embodiment, as shown in FIG. 34, one smoothing capacitor is employed. A smoothing capacitor 103 is mounted horizontally on a lower case 121, being partly exposed into the cooling air passage similarly to the first embodiment. In this embodiment also, the capacitor 103 is provided with a better cooling effect.

In this embodiment, the switching element 4 is mounted on the inner bottom surface 121 of the lower case, which is a specific distance apart from the bottom of the lower case 121 similarly as in the first embodiment. Also, the cooling fins 3a having nearly the same length are provided in the direction of length (in the horizontal direction in FIG. 33) of the bottom surface 121a which has a switching element mounting surface 121aa, and an inclined surface 121ab included towards a cooling fan mounting surface 121ac, such that the air from the cooling fan 6 will smoothly flow in. Cooling fins near the capacitor 103 have a bent section 3c so formed as to smoothly guide the stream of air to the capacitor 103. The mounting section 121b of the capacitor 103 extends parallelly with the bottom of the lower case 121 for a specific distance equal to the cooling fan mounting surface 121ac from the bottom of the lower case 121, and further extends vertically towards the bottom of the lower case. Then, after reaching the bottom of the lower case, the mounting section 121b extends for a specific distance along the bottom of the lower case. The part (partition wall) 121ba vertically extending towards the bottom of the lower case is provided with a capacitor mounting hole (not shown), and the capacitor 103 is mounted through this mounting hole. The capacitor 103 is mounted with the head (the opposite side of the terminal 103c) of the case facing the cooling fan 6; a part having the terminal 103c is covered with a vertically extending part 121ba and a part 121bb extending for a specific distance along the bottom, thereby enabling the cooling of the capacitor 103, to prevent the exposure of the charged section, and to improve safety. Above the capacitor 103, the switching element 104, and the rectifying device 106 are mounted the shielding plate 7. And above this shielding plate 7 is mounted the printed board 5a on which the logical section 5 is mounted. In this embodiment, an opening sealing member 103d of the capacitor 103 is set in a direction different from the printed board 5a; therefore if an explosion-proof valve (not shown) of the opening sealing member 103d has operated, thereby effectively preventing the adherence of electrolyte seeping from the capacitor 103 on the printed board 5a and preventing damage to the printed board 5a. Furthermore, the overall height of the device can be held low even when the height of a capacitor (size from the case head to the terminal hole) is larger than the height of the lower case 121.

Figure 35:
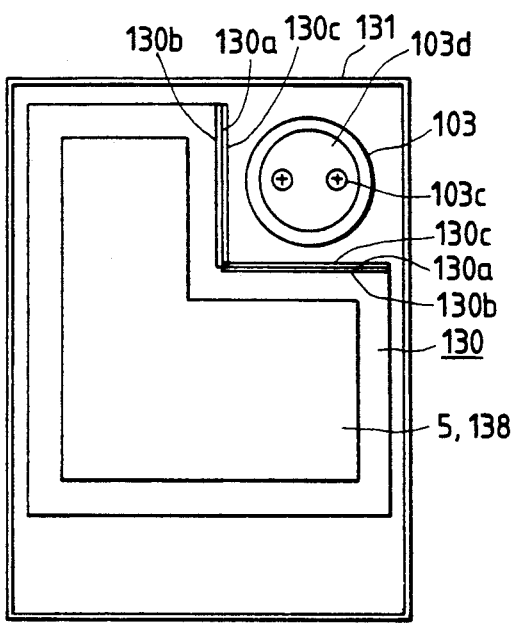
FIGS. 35 to 37 are a plan view, a side sectional view and a bottom view respectively showing an inverter device in an eighth embodiment of the invention.
Figure 36:
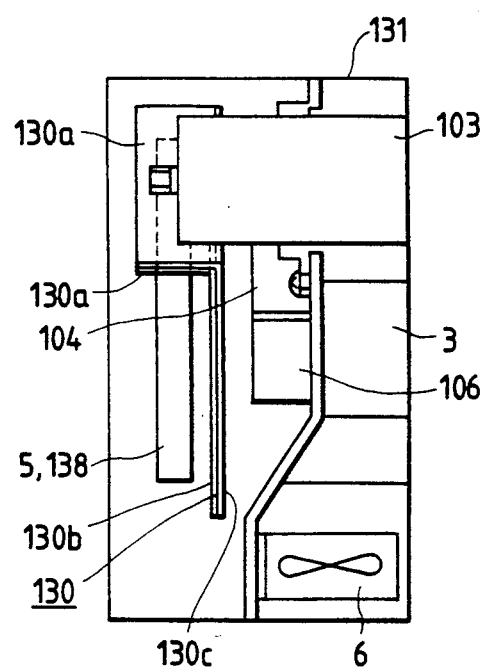
Figure 37:
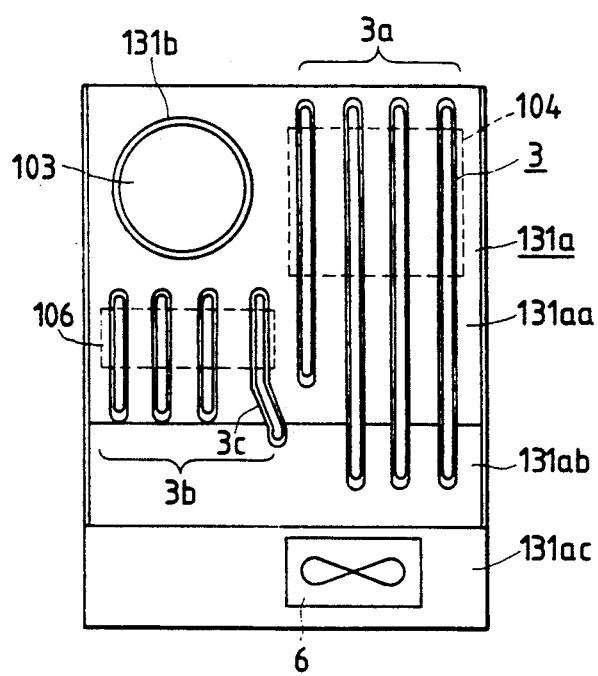

An eighth embodiment of this invention will be described with reference to FIGS. 35 to 37.

According to this embodiment, the smoothing capacitor 103 is shielded with a rising section 130a installed to the shielding plate 130, thereby enabling miniaturization of the inverter device.

In this embodiment, the bottom surface 131 of the lower case 131 comprises a switch element mounting surface 131aa, a cooling fan mounting surface 131ac, and an inclined surface 131ab formed between these surfaces. On the switching element mounting surface are mounted the cooling fins 3, which consist of the cooling fins 3a for cooling the switching element 104 and cooling fins 3b for cooling the rectifying device 106. As shown in FIG. 37, the cooling fins 3b are formed shorter than the cooling fins 3a. On the downstream side (above in FIG. 37) is provided a mounting hole 131b for mounting the capacitor 103. On the back of the surface on which the bottom 131a cooling fins 3 are provided, the switching element 104 and the rectifying device 106 are mounted. Above the switching element 104 and the rectifying device 106 (at left in FIG. 36) are located the shielding plate 130 and the printed board 138 on which the logical section 5 is mounted. In this embodiment, the printed board 138 and the shielding plate 130 are formed in an L-letter shape, in which part the rising part (partition wall) 130a is formed. The capacitor 103 is installed in such a manner that the head of case (the opposite side of the opening sealing member 103d) is positioned through inside the mounting hole 131b on the cooling fin side, and the terminal 103c portion is positioned inside of the L-letter shape of the shielding plate 130. In this embodiment, the rising part 130a is located between the opening sealing member 103d having the terminal 103c and the printed board 138, thereby separating both. Therefore, it is possible to prevent adherence of electrolyte to the printed board 138 in the event of operation of the explosion-proof valve (not shown) of the capacitor 103. In this embodiment, the shielding plate 130 is produced of an insulating material 130c on the main circuit side and of the iron plate 130b on the logical section side. According to this embodiment, the height of the inverter device can be held low if the capacitor 103 is large in height. In this embodiment also, there is provided one smoothing capacitor 103 as in the case of the seventh embodiment.

Figure 39:
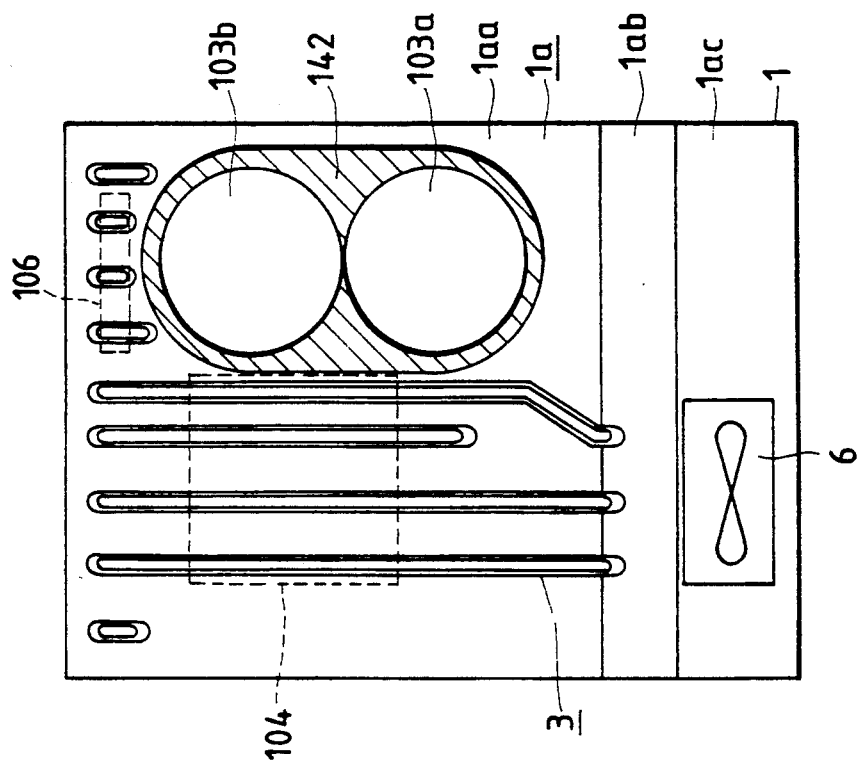
FIGS. 38 and 39 are a front view and a bottom view, partly sectioned, respectively showing an inverter device in a ninth embodiment of the invention.
Figure 38:
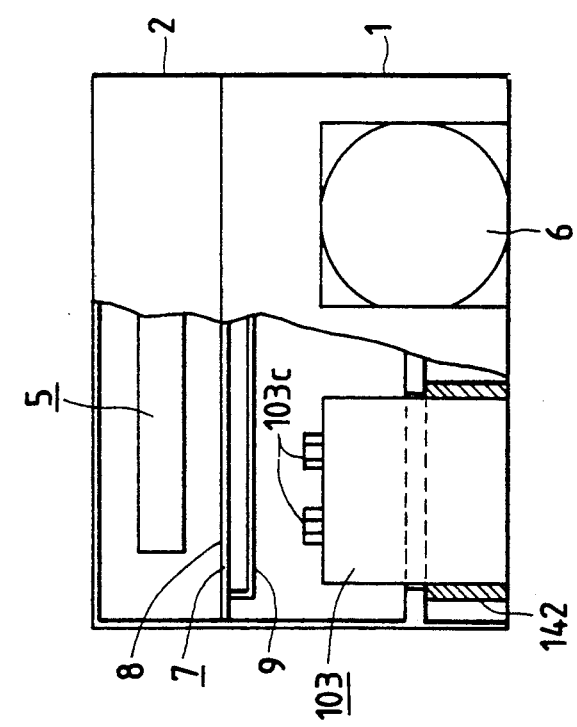

Next, a ninth embodiment of this invention will be described with reference to FIGS. 38 and 39. This embodiment is a first modification of the first embodiment, in which the projecting portions of the capacitors 103a and 103b in the cooling air passage are covered on their side with a capacitor cover 142 produced of a good heat-conductive material for effective cooling and capacitor protection purposes. The capacitor cover 142 may be made of a metal of good heat conduction such as aluminum or of epoxy resin compounded with a filler such as silica. When an aluminum capacitor cover 142 is used, an extruded material having a section shown in FIG. 39 may be used. The capacitor cover can easily be manufactured through this aluminum extrusion process. The constitution of other parts of this embodiment is identical to the first embodiment.

Figure 41:
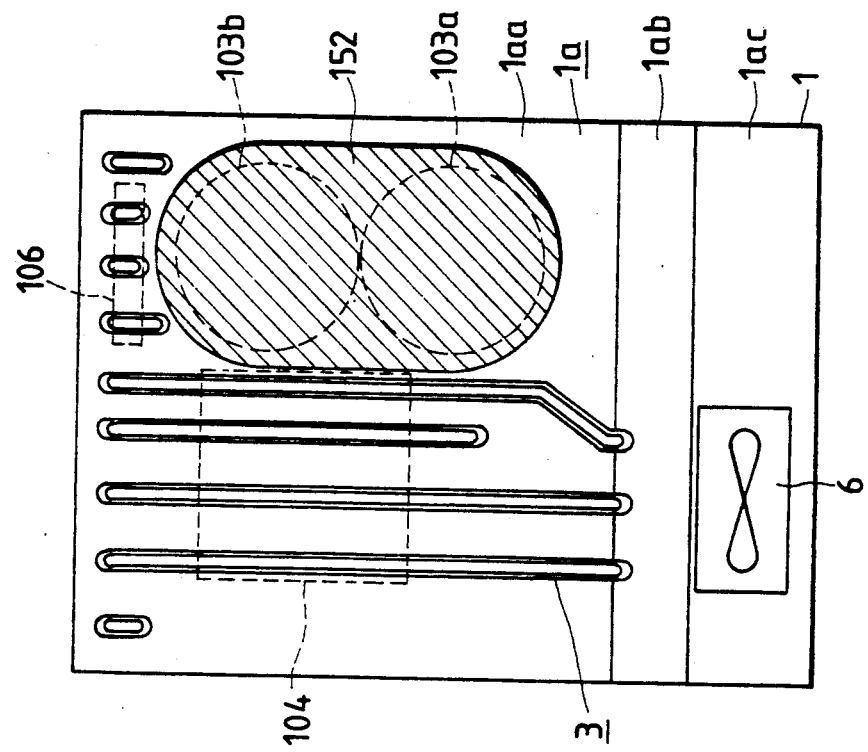
FIGS. 40 and 41 are a front view and a bottom view, partly sectioned, respectively showing an inverter device in a tenth embodiment of the invention.
Figure 40:
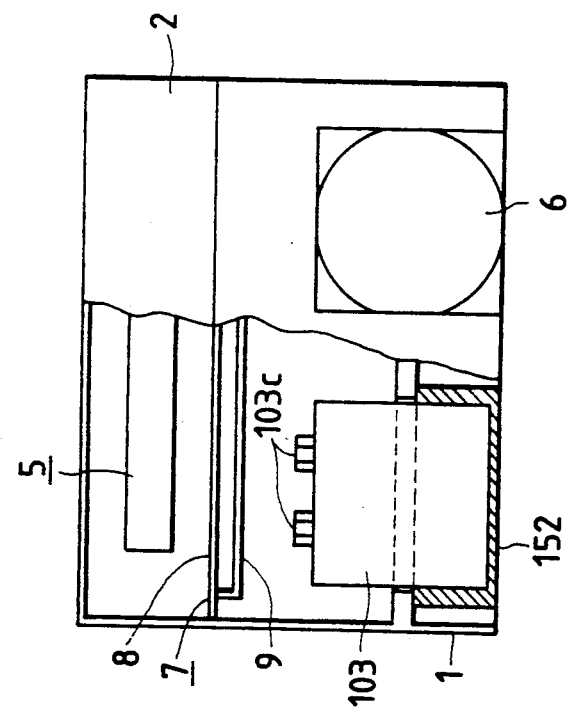

A tenth embodiment of this invention will be described with reference to FIGS. 40 and 41. This embodiment is an example of modification of the ninth embodiment, in which a capacitor cover 152 is so constituted as to cover both the side and bottom surfaces. In addition to the effect of the ninth embodiment, a capacitor bottom protecting effect can be obtained.

The capacitor cover 152 of this embodiment is also made of a material of good heat conduction. The cover 152 is produced of such a metal as aluminum or a resin of high heat conductivity such as epoxy resin compounded with a filler such as silica. This capacitor cover, having a bottom surface, is manufactured by an aluminum casting process or by an aluminum sheet drawing process when aluminum is used. Other parts of this embodiment are the same as the first embodiment.

Figure 43:
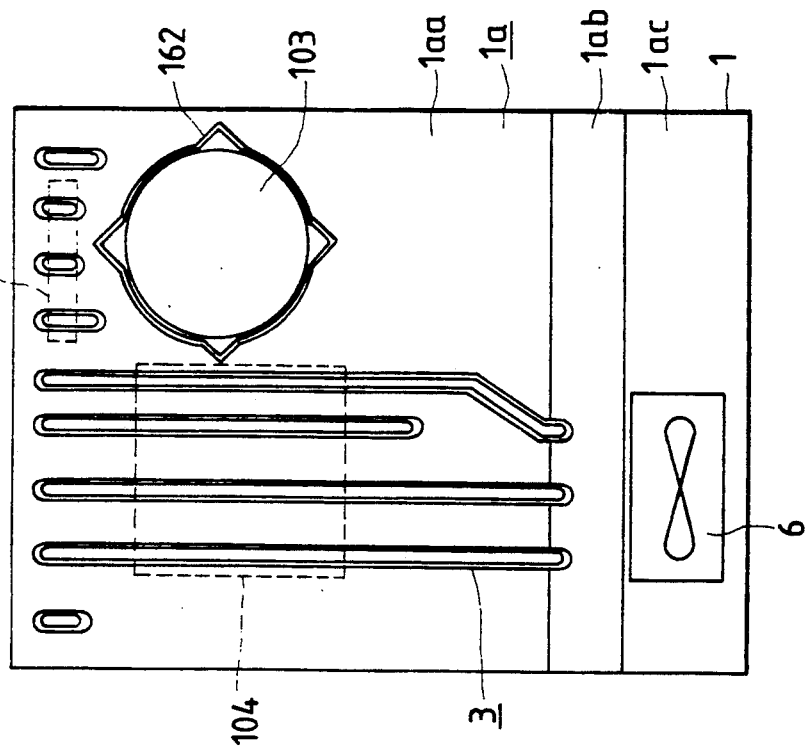
FIGS. 42 and 43 are a front view and a bottom view, partly sectioned, respectively showing an inverter device of an eleventh embodiment of the invention.
Figure 42:
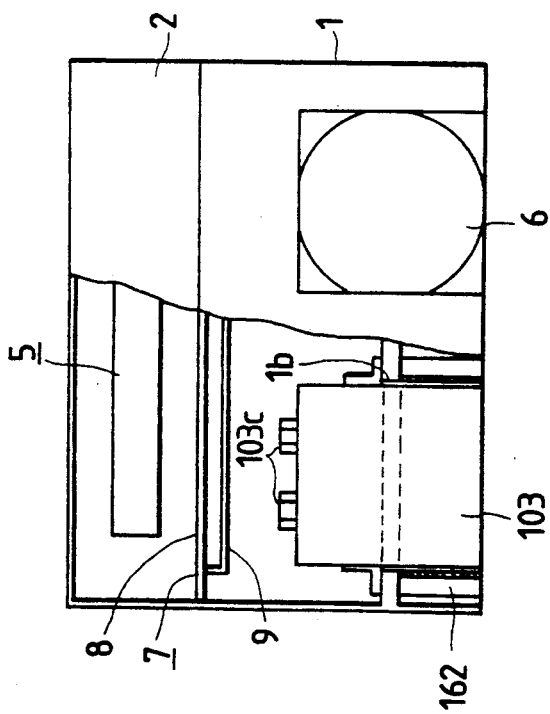

An eleventh embodiment of this invention will be described with reference to FIGS. 42 and 43. In this embodiment, the capacitor cover 162 is produced of a material (e.g., a shape memory alloy) which changes in shape with a change in temperature, coming in firm contact with the capacitor at high temperatures to insure an enhanced cooling effect.

In the first embodiment, one large-capacity capacitor is used for the capacitor 103. In this embodiment, the lower case 1 has a round capacitor mounting hole 1b in the bottom 1a, in which the head section of the capacitor 103 is inserted. After the capacitor 103 is installed, the capacitor cover 162 is mounted around the head of the capacitor 103 as shown in FIGS. 42 and 43. The capacitor cover 162 is produced of for example a shape memory j alloy and is so designed as to come in firm contact with the outer periphery of the capacitor 103 at high temperatures for the purpose of better heat dissipation from the capacitor 103. According to this embodiment, the capacitor cooling effect at high temperatures can be improved.

Although a description has been given on examples of applications of this invention to inverter devices, it should be understood that the application of the inverter device is not limited only thereto, but this invention may be applied also to other electronic equipment comprising the same constituting elements.

Also, in the seventh, ninth, tenth and eleventh embodiments is used the shielding plate 7 as in the case of the first embodiment. It, however, should be noted that it is not limited to the above-described but the shielding plate used in the second to fifth embodiment may be used in accordance with conditions such as the amount of heat generated at the main circuit section and the outside dimensions of the inverter device. Also, depending upon conditions, a communicating section communicating between the main circuit side and the logical section side may be provided on the bottom side of the inverter device as in the case of the sixth embodiment.

Subsequently, a twelfth embodiment of this invention will be described with reference to FIGS. 44 and 45.

Figure 44:
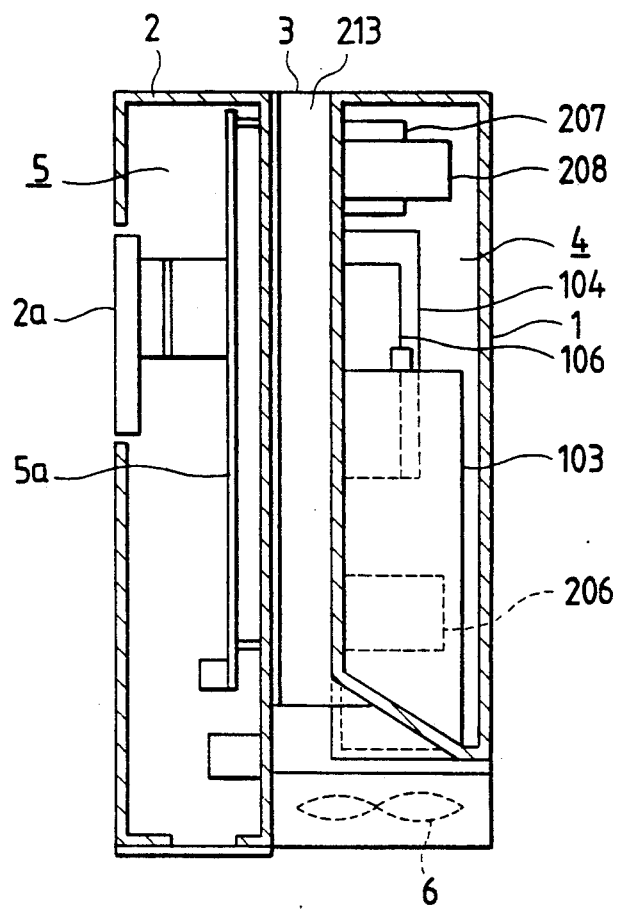
FIG. 44 is a longitudinal side view showing the constitution of an inverter device according to a twelfth embodiment of the invention.
Figure 45:
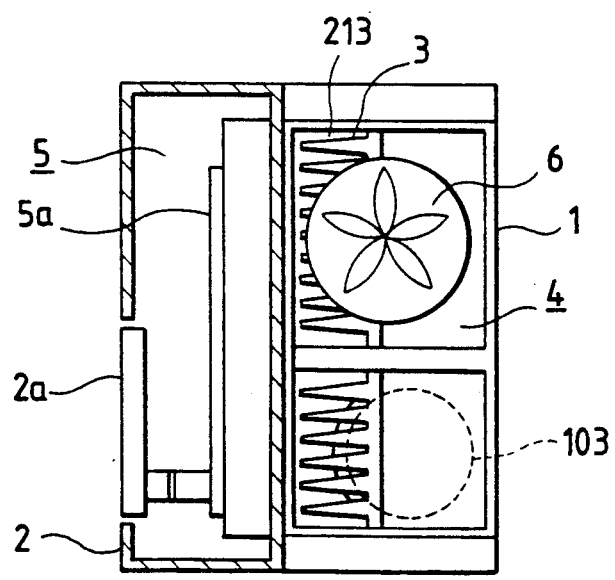
FIG. 45 is a front view, partly sectioned, of this embodiment.

In FIGS. 44 and 45, numeral 4 denotes a main circuit section, which is provided with a hermetically closed case 1. In this case 1 are provided a power rectifier 106 which converts the a.c. power supply to the d.c. power supply, a smoothing capacitor 103 for smoothing the d.c. power output from the power rectifier 106, a power inverter 104 which converts the d.c. power supply to the a.c. power supply, a current detecting sensor 206, a resistor 207, and a contactor 208. The power rectifier 106 and the power inverter 104 are provided each with switching elements of semiconductors such as a rectifying diode, or a transistor, or a thyristor. Numeral 5 is a logical section, which is provided with a hermetically sealed case 2, apart from the main circuit section 4. In this case 2 is mounted a control panel 5a for performing various kinds of controls of the inverter device and for controls of a switching pattern of the switching elements of the power rectifier 206 and the power inverter 104. To this control panel 5a is connected an operating section 2a. This control panel 5a is connected by signal lines (not shown) to the power rectifier 106 and the power inverter 104 of the main circuit section 4. Numeral 213 represents a refrigerant passage for a cooling fluid disposed between the logical section 5 and the main circuit section 4. Within this refrigerant passage 213 are installed heat-dissipating fins 3. In the lower part of the refrigerant passage 213 is mounted the fan 6.

The source of heat generation in this embodiment is mainly the power rectifier 106 and the power inverter 104 in the main circuit section 4. Heat generated at these converters 106 and 104 passes to the heat-dissipating fins 3 and further is discharged out by the air supplied from the fan 6 into the refrigerant passage 213. In the logical section 5 also, heat is generated at the control panel 5a, but this heat passes to the refrigerant passage 213 side through natural convection within the case 2, being discharged out by the air supplied from the fan 6. In consequence, the source of heat at the main circuit section 4 can effectively be cooled and at the same time the heat generated at the main circuit section 4 is removed by the air supplied into the refrigerant passage 213 as described above, and therefore will never be allowed to pass to the logical section 5.

In the embodiment of this invention, it is desired that the heat-dissipating fins 3 be formed integral with a part of the case 1 of the main circuit section 4 and that parts generating much heat be directly secured in this section. This heat dissipation at the main circuit section 4 can be accelerated by contiguously securing component parts of the main circuit section 4 to the base of the heat-dissipating fins 3.

The temperature in the refrigerant passage 213 is lower on the inlet side, or on the fan 6 side, than on the outlet side. It is therefore desirable that the smoothing capacitor 103 of low permissible temperature and transistors generating heat but at low permissible temperature be disposed on the air inlet side of the passage. Similarly, it is desirable to arrange parts of low permissible temperature on the control panel 5a on the air inlet side of the passage if possible.

Figure 46:
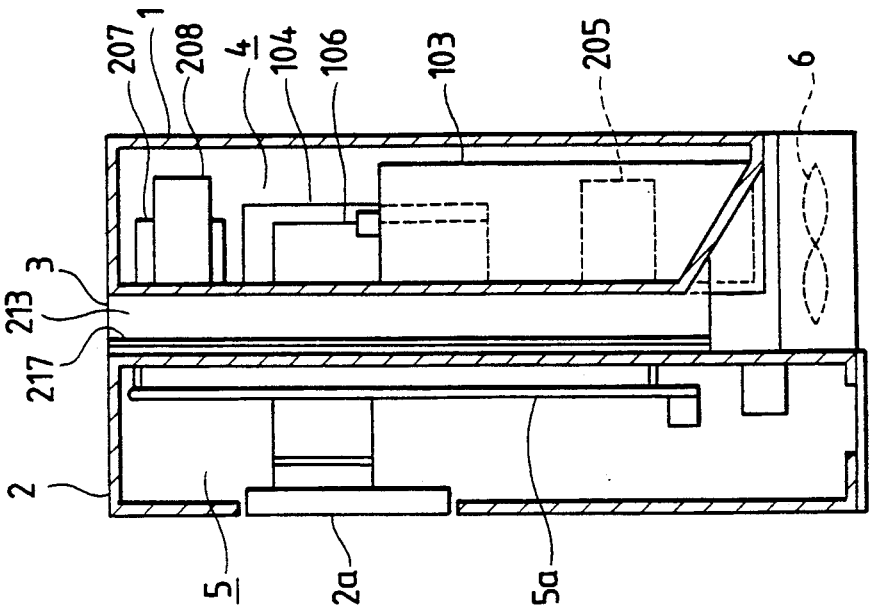
FIGS. 46 to 48 are longitudinal side views respectively showing the constitution of inverter devices in thirteenth to fifteenth embodiments of the invention.

Next, a thirteenth embodiment of this invention will be described with reference to FIG. 46.

In this embodiment, guides 216 for guiding the stream of air in the heat-dissipating section to the base plate side of the fins 3 are provided among the heat-dissipating fins 3, thereby enhancing the heat-dissipating fins 3 cooling effect. The temperature of the heat-dissipating fins 3 is high at the root and has a little difference from the air temperature at the forward end section. The air flowing at the root of the fins 3 is likely to increase. Guiding the air flowing at the forward end side of the fins 3 to the root side increases the air velocity at the root side of the fins 3, thus improving heat transmission. Also, decreasing the air temperature at the root side of the fins 3 increases a temperature difference from the fins 3, thereby improving the heat-transmission performance and facilitating the miniaturization of the fins 3.

Figure 47:
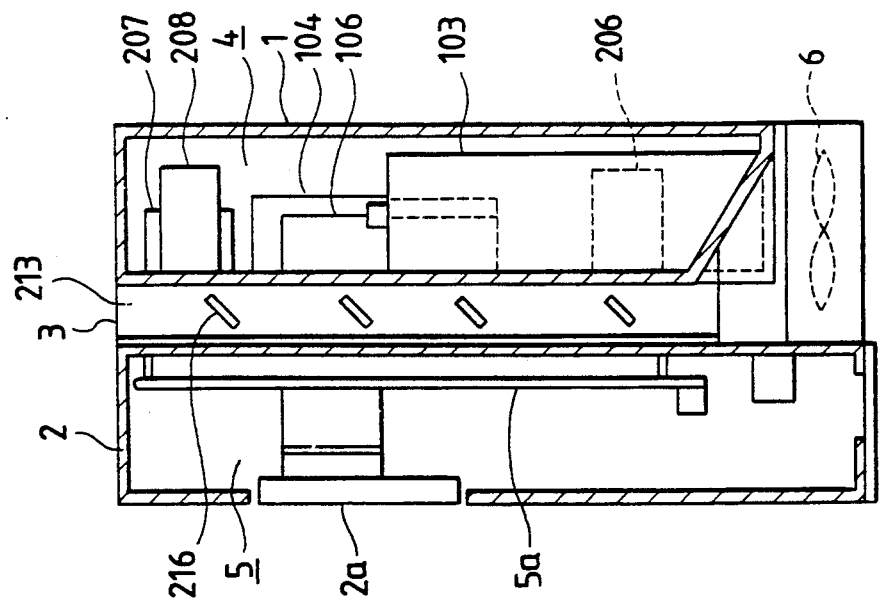

A fourteenth embodiment of this invention will be described with reference to FIG. 47.

In this embodiment, a partition plate 217 is provided at the forward end of the heat-dissipating fins 3, providing a space between the logical section 5 and the partition plate 217. The cooling air temperature rises as it goes towards the outlet. In the case of little cooling air volume, the air temperature at the outlet will increase considerably. The partition plate 217 serves to prevent heat transmission from the heated air to the logical section 5 when the heated air flows along the wall surface of the logical section side. Between the partition plate 217 and the logical section 5, the air from the fan 6 may be partly passed or may be allowed to flow not positively but by natural convection. Thus the main circuit section 4 and the logical section 5 can be fully separated for the purpose of heat prevention.

Figure 48:
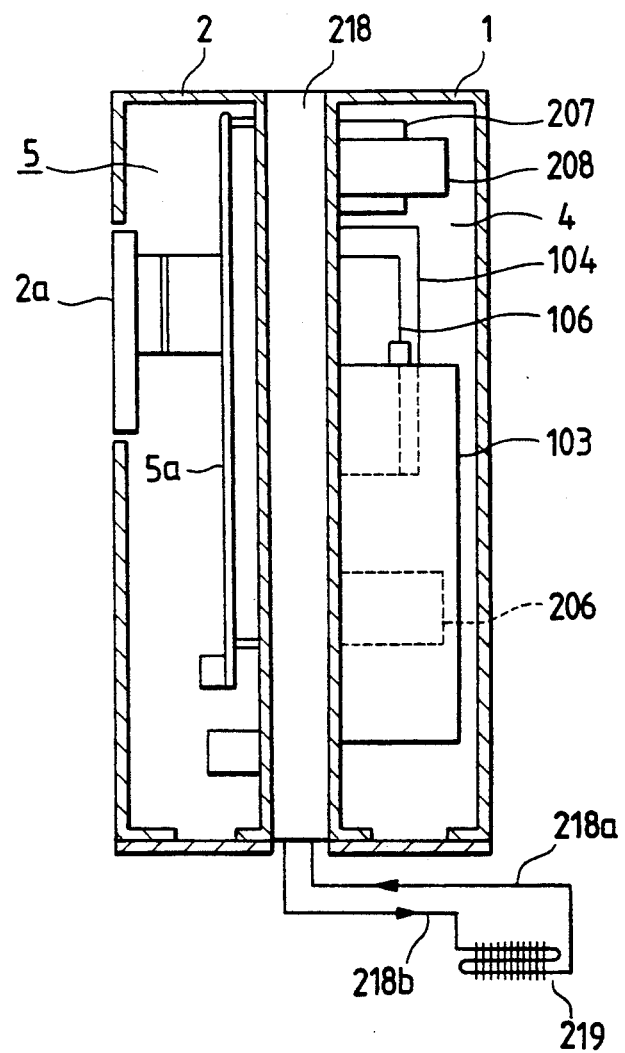

Next, a fifteenth embodiment of this invention will be described with reference to FIG. 48.

This embodiment provides a water-cooled inverter device, in which a refrigerant passage is a water cooler 218 formed to flow a coolant therein, component elements of the main circuit section 4 are mounted on the wall surface of this water cooler 218, and the logical section 5 is located in an opposite position beyond the coolant passage. Adopting this embodiment can improve cooling performance and considerably miniaturize the heat-dissipating section. The water cooler 218 is connected to an heat exchanger 219 by a supply pipe 218a and a return pipe 218b. Therefore, the coolant cooled by the heat exchanger 219 is supplied through this supply pipe 218a, while the coolant heated in the water cooler 218 returns for cooling to the heat exchanger 219 through the return pipe 218b.

What is claimed is:

1. An inverter device, comprising:
   a housing;
   a main circuit section including a heat generating element;
   a logical circuit section disposed apart from said main circuit section;
   a first chamber formed in said housing for enclosing said logical circuit section and having a totally enclosed structure for preventing foreign substances from entering therein;
   a second chamber formed in said housing for enclosing said main circuit section and having a totally enclosed structure for preventing the foreign substances from entering therein; and
   a cooling passage disposed between said first and second chambers for cooling said main circuit section and said logical circuit section, said cooling passage being provided independent of said first and second chambers, respectively.

2. An inverter device as claimed in claim 1, wherein said cooling passage is provided with an air inlet port and an air outlet port, said inlet and outlet ports being formed to allow outside air to flow therein.

3. An inverter device as claimed in claim 2, wherein said air inlet port is provided on opposite side portions of one end of said cooling passage, and said air outlet port is provided on the other end of said cooling passage.

4. An inverter device as claimed in claim 1, wherein said second chamber has heat-dissipating fins on an outer surface thereof facing to said cooling passage.

5. An inverter device as claimed in claim 4, wherein said heat-dissipating fins are provided with guides for directing the air stream toward the fins which are disposed so as to correspond to said heat generating element.

6. An inverter device according to claim 1, further comprising an electro-magnetic shielding member provided on at least a part of said cooling passage for preventing electro-magnetic noise from being transmitted to said logical circuit section.

7. An inverter device, as claimed in claim 6, wherein said electro-magnetic shielding member is provided on a same side of said cooling passage as said logical circuit section.

8. An inverter device as claimed in claim 6, wherein said electro-magnetic shielding member is disposed so as to separate said cooling passage from said first chamber.

9. An inverter device as claimed in claim 6, wherein a heat shielding member is provided on a side opposite to said electro-magnetic shielding member in said cooling passage, and said electro-magnetic shielding member is disposed so as to form an air stratum between said heat shielding member.

10. An inverter device, comprising:
    a housing;
    a main circuit section including a heat generating element;
    a logical circuit section disposed apart from said main circuit section;
    a first chamber independently formed in said housing for enclosing said logical circuit section and having a totally enclosed structure for preventing foreign substances from entering therein;
    a second chamber independently formed in said housing for enclosing said main circuit section and having a totally enclosed structure for preventing the foreign substances from entering therein, said first and second chambers being disposed so as to form a cooling passage therebetween.

11. An inverter device as claimed in claim 10, wherein said cooling passage provides for thermal insulation of said logical circuit section from said main circuit section.

12. An inverter device as claimed in claim 11, wherein said cooling passage is provided with an air inlet port and an air outlet port, said inlet and outlet ports being formed to allow outside air to flow therein.

13. An inverter device as claimed in claim 12, wherein said air inlet port is provided on opposite side portions of one end of said cooling passage, and said air outlet port is provided on the other end of said cooling passage.

14. An inverter device as claimed in claim 11, wherein said second chamber has heat-dissipating fins formed on an outer surface thereof and facing to said cooling passage.

15. An inverter device as claimed in claim 14, wherein said heat-dissipating fins are provided with guides for directing an air stream toward fins which are disposed so as to correspond to said heat generating element.

16. An inverter device as claimed in claim 11, further comprising a fan for supplying an air flow in said cooling passage.

17. An inverter device as claimed in claim 11, wherein said cooling passage is provided with a heat insulating member disposed so as to face said main circuit section for insulating heat from said heat-generating element.

18. An inverter device as claimed in claim 11, wherein said cooling passage is formed to allow a flow of a coolant therein.

19. An inverter device according to claim 10, further comprising an electro-magnetic shielding member disposed on one side of said cooling passage.

20. An inverter device as claimed in claim 19, wherein said cooling passage is provided with a heat insulating member disposed on a side opposite to said electro-magnetic shielding member in said cooling passage for shielding heat from said heat generating element.

21. An inverter device according to claim 1, further comprising a second cooling passage disposed along an outer surface of said second chamber on a side opposite to said cooling passage.

22. An inverter device as claimed in claim 21, wherein said cooling passage and said second cooling passage are disposed such that a portion of an air flow bypasses said second cooling passage through said cooling passage.

23. An inverter device as claimed in claim 21, further comprising a fan for supplying an air flow at least in said second cooling passage.

24. An inverter device as claimed in claim 21, wherein said cooling passage is provided with an air inlet port and an air outlet port being formed to allow outside air to flow therein.

25. An inverter device as claimed in claim 24, wherein said air inlet port is provided on opposite side portions of one end of said cooling passage, and said air outlet port is provided on the other end of said cooling passage.

26. An inverter device as claimed in claim 21, wherein said second chamber has heat-dissipating fins on an outer surface thereof facing to said cooling passage.

27. An inverter device as claimed in claim 26, wherein said heat-dissipating fins are provided with guides for directing an air stream toward fins which are disposed so as to correspond to said heat generating element.

28. An inverter device as claimed in claim 21, wherein said cooling passage is connected with said second cooling passage such that a branched portion of an air stream from said second cooling passage flows in said cooling passage.

29. An inverter device as claimed in claim 21, wherein said cooling passage has a communicating passage connecting said second cooling passage with said cooling passage, said communicating passage being formed to induce air from said cooling passage to flow to said second cooling passage.

30. An inverter device, comprising:
a housing;
a main circuit section including a heat generating element and a smoothing capacitor;
a logical circuit section disposed apart from said main circuit section;
a first chamber formed in said housing for enclosing said logical circuit section and having a totally enclosed structure for preventing foreign substances from entering therein;
a second chamber formed in said housing for enclosing said main circuit section and having a totally enclosed structure for preventing the foreign substances from entering therein;
a cooling passage disposed between said first and second chambers for cooling said main circuit section and said logic circuit section, said cooling passage being provided independent of said first and second chambers, respectively; and
a second cooling passage being disposed along an outer surface of said second chamber on a side opposite to said cooling passage, wherein said smoothing capacitor is disposed so as to partially protrude into said second cooling passage.

31. An inverter device as claimed in claim 30, wherein said second chamber has heat-dissipating fins, at least one of said heat-dissipating fins having a bent section formed so as to guide an air flow to a portion of said smoothing capacitor which faces said second cooling passage.

32. An inverter device as claimed in claim 30, wherein said smoothing capacitor is vertically disposed and protrudes through a bottom of said second chamber, said bottom of said second chamber being disposed on a horizontal plane.

33. An inverter device as claimed in claim 30, wherein said smoothing capacitor is horizontally disposed and protrudes through a vertical extending portion formed in said second chamber.

34. An inverter device as claimed in claim 30, wherein said smoothing capacitor is comprised of capacitors connected in parallel so as to increase a surface area thereof.

35. An inverter device, comprising:
a housing;
a main circuit section including a heat generating element and a smoothing capacitor;
a logical circuit section disposed apart from said main circuit section;
a first chamber formed in said housing for enclosing said logical circuit section and having a totally enclosed structure for preventing foreign substances from entering therein;
a second chamber formed in said housing for enclosing said main circuit section and having a totally enclosed structure for preventing the foreign substances from entering therein; and
a cooling passage disposed between said first and second chambers for cooling said main circuit section and said logic circuit section, said cooling passage being provided independent of said first and second chambers, respectively, and said smoothing capacitor being disposed so as to partially protrude into said cooling passage.

36. An inverter device as claimed in claim 35, wherein said smoothing capacitor is vertically disposed in said second chamber so as to protrude into said cooling passage, said cooling passage being disposed on a horizontal plane with respect to said smoothing capacitor.

37. An inverter device as claimed in claim 35, wherein said smoothing capacitor is horizontally disposed in said second chamber so as to protrude into said cooling passage, said cooling passage being disposed on a vertical plane with respect to said smoothing capacitor.

38. An inverter device, comprising:
a housing;
a main circuit section including a heat generating element and a smoothing capacitor;
a logical circuit section disposed apart from said main circuit section;
a first chamber independently formed in said housing for enclosing said logical circuit section and having a totally enclosed structure for preventing foreign substances from entering therein;
a second chamber independently formed in said housing for enclosing said main circuit section and having a totally enclosed structure for preventing the foreign substances from entering therein, said first chamber and said second chamber being disposed so as to form a cooling passage therebetween in order to provide for thermal insulation of said logical circuit section from said main circuit section; and
a second cooling passage disposed along an outer surface of said second chamber on a side of said second chamber opposite to said cooling passage.

39. An inverter device, according to claim 38, wherein said main circuit section further includes a smoothing capacitor, said smoothing capacitor being disposed so as to partially protrude into said cooling passage.

40. An inverter device, comprising:
a housing;
a main circuit section including a heat generating element and a smoothing capacitor;
a logical circuit section disposed apart from said main circuit section;
a first chamber formed in said housing for enclosing said logical circuit section and having a totally enclosed structure for preventing foreign substances from entering therein;
a second chamber formed in said housing for enclosing said main circuit section and having a totally enclosed structure for preventing the foreign substances from entering therein;
a cooling passage disposed between said first and second chambers for cooling said main circuit section and said logic circuit section, said cooling passage being provided independent of said first and second chambers, respectively;
an electro-magnetic shielding member provided on at least a part of said cooling passage for preventing electro-magnetic noise from said main circuit section from being transmitted to said logical circuit section; and
a second cooling passage disposed along an outer surface of said second chamber on a side of said second cooling passage, said smoothing capacitor being disposed so as to partially protrude into said second cooling passage.

41. An inverter device, comprising:
a housing having an enclosure for preventing foreign substances from entering therein;
a main circuit section disposed in said housing on a bottom of said housing and including a heat generating element and a smoothing capacitor;
a logical circuit section disposed apart from said main circuit section in said housing;
an electro-magnetic shield member disposed between said main circuit section and said logical circuit section for preventing electro-magnetic noise from said main circuit section from being transmitted to said logical circuit section;
a cooling passage disposed along an outer bottom surface of said housing, said smoothing capacitor being disposed so as to partially protrude into said cooling passage and having terminals which are disposed at a side of said electro-magnetic shielding member at which said main circuit section is disposed.

* * * * *